(12) United States Patent
Kim et al.

(10) Patent No.: US 9,842,841 B2
(45) Date of Patent: Dec. 12, 2017

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Ji Hun Kim, Hwaseong-si (KR); Ilgweon Kim, Hwaseong-si (KR); Junhwa Song, Incheon (KR); Jeonghoon Oh, Seoul (KR); WonSeok Yoo, Hwaseong-si (KR); Eun-Sun Lee, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 5 days.

(21) Appl. No.: 14/849,651

(22) Filed: Sep. 10, 2015

(65) Prior Publication Data
US 2016/0079246 A1 Mar. 17, 2016

(30) Foreign Application Priority Data
Sep. 17, 2014 (KR) ........................ 10-2014-0123798

(51) Int. Cl.
*H01L 21/8242* (2006.01)
*H01L 21/762* (2006.01)
(Continued)

(52) U.S. Cl.
CPC .. *H01L 27/10894* (2013.01); *H01L 21/76224* (2013.01); *H01L 21/823412* (2013.01);
(Continued)

(58) Field of Classification Search
CPC ..... H01L 21/823412; H01L 21/823807; H01L 27/1085; H01L 27/10873; H01L 27/10885;
(Continued)

(56) References Cited

U.S. PATENT DOCUMENTS

| | | | | |
|---|---|---|---|---|
| 4,788,580 | A | * | 11/1988 | Arimoto ........... H01L 27/10844 257/297 |
| 5,268,324 | A | * | 12/1993 | Aitken ................ H01L 21/8238 148/DIG. 82 |

(Continued)

FOREIGN PATENT DOCUMENTS

| | | |
|---|---|---|
| JP | 2002-118255 A | 4/2002 |
| JP | 2007-042730 A | 2/2007 |
| JP | 2013-182991 A | 9/2013 |

*Primary Examiner* — Mary Wilczewski
(74) *Attorney, Agent, or Firm* — Lee & Morse, P.C.

(57) ABSTRACT

A method of fabricating a semiconductor device, the method including etching a portion of a substrate including a first region and a second region to form a device isolation trench; forming a device isolation layer defining active regions by sequentially stacking a first insulating layer, a second insulating layer, and a third insulating layer on an inner surface of the device isolation trench; forming word lines buried in the substrate of the first region, the word lines extending in a first direction to intersect the active region of the first region, the word lines being spaced apart from each other; forming a first mask layer covering the word lines on the substrate of the first region, the first mask layer exposing the substrate of the second region; forming a channel layer on the substrate of the second region; and forming a gate electrode on the channel layer.

18 Claims, 20 Drawing Sheets

(51) Int. Cl.
  *H01L 21/311* (2006.01)
  *H01L 27/108* (2006.01)
  *H01L 21/8234* (2006.01)
  *H01L 21/8238* (2006.01)
  *H01L 49/02* (2006.01)

(52) U.S. Cl.
  CPC .. *H01L 21/823807* (2013.01); *H01L 27/1085* (2013.01); *H01L 27/10805* (2013.01); *H01L 27/10814* (2013.01); *H01L 27/10817* (2013.01); *H01L 27/10855* (2013.01); *H01L 27/10873* (2013.01); *H01L 27/10891* (2013.01); *H01L 28/91* (2013.01)

(58) Field of Classification Search
  CPC ......... H01L 27/10891; H01L 27/10894; H01L 21/76224; H01L 27/10805
  USPC ...................................................... 438/300
  See application file for complete search history.

(56) References Cited

U.S. PATENT DOCUMENTS

| | | | | |
|---|---|---|---|---|
| 5,268,587 A * | 12/1993 | Murata | H01L 27/10805 | 257/357 |
| 5,504,033 A * | 4/1996 | Bajor | H01L 21/76224 | 257/E21.546 |
| 6,001,706 A * | 12/1999 | Tan | H01L 21/76232 | 257/E21.549 |
| 6,180,987 B1 * | 1/2001 | Gardner | H01L 29/78675 | 257/343 |
| 6,214,678 B1 * | 4/2001 | Docter | H01L 29/66462 | 257/E21.108 |
| 6,429,061 B1 * | 8/2002 | Rim | H01L 21/0237 | 257/E21.131 |
| 6,541,351 B1 * | 4/2003 | Bartlau | H01L 21/31105 | 257/E21.564 |
| 6,703,271 B2 * | 3/2004 | Yeo | H01L 21/28114 | 257/E21.205 |
| 7,282,402 B2 * | 10/2007 | Sadaka | H01L 29/1054 | 257/E21.63 |
| 7,538,002 B2 * | 5/2009 | Zhang | H01L 29/66772 | 257/E21.431 |
| 7,572,705 B1 * | 8/2009 | Besser | H01L 29/66772 | 257/E21.431 |
| 7,655,988 B2 * | 2/2010 | Jang | H01L 29/7851 | 257/401 |
| 7,667,266 B2 * | 2/2010 | Jung | H01L 21/823412 | 257/328 |
| 7,732,864 B2 | 6/2010 | Kawahara et al. | | |
| 7,750,374 B2 * | 7/2010 | Capasso | H01L 21/823807 | 257/204 |
| 7,910,996 B2 * | 3/2011 | Besser | H01L 29/66628 | 257/347 |
| 8,273,617 B2 | 9/2012 | Thompson et al. | | |
| 8,361,858 B2 * | 1/2013 | Kronholz | H01L 21/823462 | 257/24 |
| 8,482,077 B2 * | 7/2013 | Lee | H01L 21/823412 | 257/369 |
| 8,486,786 B2 * | 7/2013 | Kronholz | H01L 21/823807 | 257/392 |
| 8,501,585 B2 * | 8/2013 | Yamazaki | H01L 27/1214 | 438/455 |
| 8,530,286 B2 | 9/2013 | Shifren et al. | | |
| 8,569,156 B1 | 10/2013 | Scudder et al. | | |
| 8,604,527 B2 | 12/2013 | Thompson et al. | | |
| 8,604,530 B2 | 12/2013 | Thompson et al. | | |
| 8,614,128 B1 | 12/2013 | Thompson et al. | | |
| 8,629,016 B1 | 1/2014 | Hoffmann et al. | | |
| 8,637,955 B1 * | 1/2014 | Wang | H01L 21/743 | 257/506 |
| 8,645,878 B1 | 2/2014 | Clark et al. | | |
| 9,224,634 B2 * | 12/2015 | Sonsky | H01L 21/76264 | |
| 9,406,567 B1 * | 8/2016 | Shifren | H01L 21/823807 | |
| 2001/0045604 A1 * | 11/2001 | Oda | B82Y 10/00 | 257/350 |
| 2005/0176214 A1 * | 8/2005 | Chang | H01L 21/763 | 438/424 |
| 2006/0073662 A1 * | 4/2006 | Jang | H01L 29/7851 | 438/299 |
| 2006/0186509 A1 * | 8/2006 | Larsen | H01L 21/3086 | 257/506 |
| 2006/0228851 A1 * | 10/2006 | Sadaka | H01L 29/1054 | 438/221 |
| 2007/0132035 A1 * | 6/2007 | Ko | H01L 21/823807 | 257/374 |
| 2008/0157225 A1 * | 7/2008 | Datta | H01L 27/105 | 257/401 |
| 2008/0303085 A1 * | 12/2008 | Jung | H01L 21/823412 | 257/330 |
| 2009/0057746 A1 * | 3/2009 | Sugll | H01L 21/82385 | 257/315 |
| 2009/0134468 A1 * | 5/2009 | Tsuchiya | H01L 21/84 | 257/368 |
| 2010/0015771 A1 * | 1/2010 | Hsieh | H01L 21/324 | 438/275 |
| 2010/0193881 A1 * | 8/2010 | Kronholz | H01L 21/823462 | 257/402 |
| 2010/0289090 A1 * | 11/2010 | Kronholz | H01L 21/823807 | 257/392 |
| 2010/0289094 A1 * | 11/2010 | Reichel | H01L 21/823412 | 257/409 |
| 2010/0327368 A1 * | 12/2010 | Kronholz | H01L 21/823857 | 257/369 |
| 2011/0042751 A1 * | 2/2011 | Kim | H01L 21/82345 | 257/369 |
| 2011/0079861 A1 | 4/2011 | Shifren et al. | | |
| 2011/0101427 A1 * | 5/2011 | Scheiper | H01L 21/266 | 257/288 |
| 2011/0156172 A1 * | 6/2011 | Kronholz | H01L 21/84 | 257/402 |
| 2011/0269277 A1 * | 11/2011 | Kronholz | H01L 21/3083 | 438/218 |
| 2011/0309447 A1 * | 12/2011 | Arghavani | H01L 21/823412 | 257/368 |
| 2012/0080759 A1 * | 4/2012 | Ema | H01L 21/823807 | 257/402 |
| 2012/0156846 A1 * | 6/2012 | Thees | H01L 21/76232 | 438/285 |
| 2012/0164805 A1 * | 6/2012 | Kronholz | H01L 21/823807 | 438/276 |
| 2012/0235245 A1 * | 9/2012 | Pal | H01L 21/823481 | 257/368 |
| 2013/0075820 A1 * | 3/2013 | Scheiper | H01L 21/76232 | 257/368 |
| 2013/0161695 A1 * | 6/2013 | Kronholz | H01L 21/823462 | 257/192 |
| 2013/0230964 A1 | 9/2013 | Imai et al. | | |
| 2013/0328129 A1 | 12/2013 | Shifren et al. | | |
| 2014/0038386 A1 | 2/2014 | Scudder | | |
| 2014/0070325 A1 * | 3/2014 | Kim | H01L 27/088 | 257/368 |
| 2014/0119099 A1 | 5/2014 | Clark et al. | | |
| 2014/0346564 A1 * | 11/2014 | Doornbos | H01L 21/823412 | 257/190 |
| 2016/0079246 A1 * | 3/2016 | Kim | H01L 21/76224 | 257/401 |
| 2016/0240630 A1 * | 8/2016 | Seong | H01L 29/66545 | |

\* cited by examiner

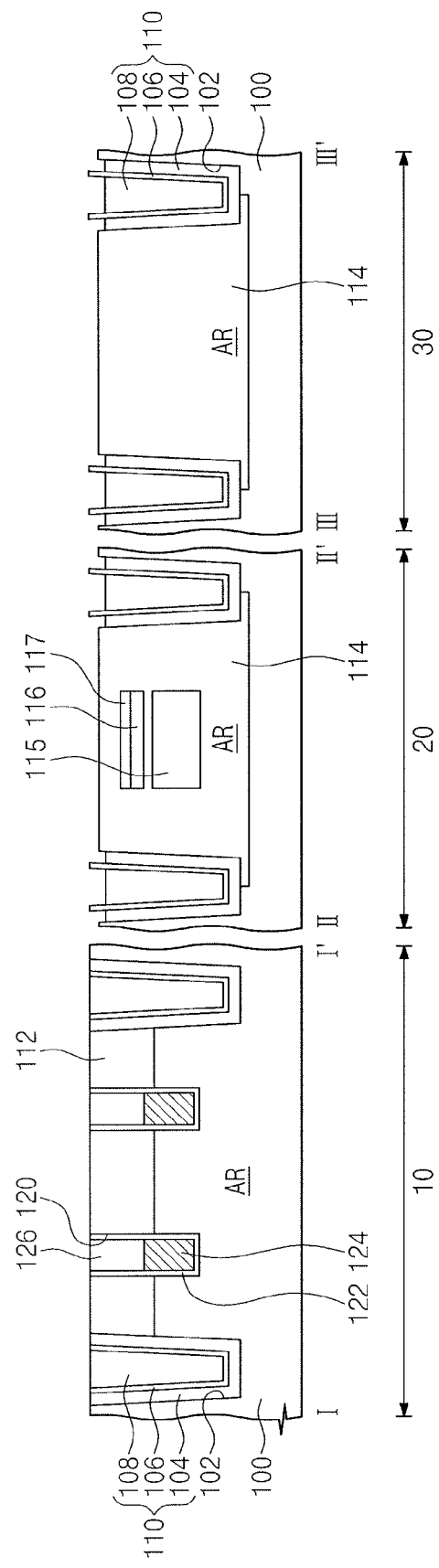

SEMICONDUCTOR DEVICE AND METHOD OF FABRICATING THE SAME

CROSS-REFERENCE TO RELATED APPLICATION

Korean Patent Application No. 10-2014-0123798, filed on Sep. 17, 2014, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As design rules of semiconductor devices have been reduced, fabricating techniques have been developed to improve integration degrees, operating speeds, and yields of semiconductor devices. For example, to improve a degree of integration, a recess gate or a buried gate may be substituted for a planar gate.

SUMMARY

Embodiments may be realized by providing a method of fabricating a semiconductor device, the method including etching a portion of a substrate including a first region and a second region to form a device isolation trench; forming a device isolation layer defining active regions by sequentially stacking a first insulating layer, a second insulating layer, and a third insulating layer on an inner surface of the device isolation trench; forming word lines buried in the substrate of the first region, the word lines extending in a first direction to intersect the active region of the first region, the word lines being spaced apart from each other; forming a first mask layer covering the word lines on the substrate of the first region, the first mask layer exposing the substrate of the second region; forming a channel layer on the substrate of the second region; and forming a gate electrode on the channel layer.

During formation of word lines, the first and third insulating layers of the second region may be etched to expose a portion of an upper portion of the second insulating layer of the second region.

During formation of the word lines, the first and third insulating layers of the second region may be etched more than the substrate of the second region such that a portion of a sidewall of the substrate adjacent to the first insulating layer is exposed in the second region.

The channel layer may include a bottom surface having a first bottom surface in contact with a top surface of the substrate and a second bottom surface in contact with the exposed portion of the sidewall of the substrate; a top surface opposite to the first bottom surface; and a sidewall connected to one end of the bottom surface and one end of the top surface of the channel layer. The sidewall of the channel layer may include a first sidewall and a second sidewall that meet each other at a first point. The first sidewall may connect the first point to a second point at which the first insulating layer meets the sidewall of the substrate. The second sidewall may connect the one end of the top surface of the channel layer to the first point.

The sidewall of the channel layer may have a corner at the first point.

A first angle between the first sidewall and the second sidewall may be greater than 0 degrees and less than 180 degrees, a second angle between the first sidewall and the sidewall of the substrate may be greater than 0 degrees and less than 90 degrees, and a third angle between the second sidewall and the top surface of the channel layer may be greater than 0 degrees and less than 180 degrees.

During formation of the word lines, the first and third insulating layers and the substrate of the second region may be etched such that an etched top surface of the substrate is at a substantially same level as etched topmost surfaces of the first and third insulating layers in the second region. In the second region, a topmost surface of the second insulating layer may be higher than the etched top surface of the substrate and the etched topmost surfaces of the first and third insulating layers.

During formation of the word lines, the substrate of the second region may be etched more than the first and third insulating layers of the second region such that a portion of a sidewall of the first insulating layer adjacent to the substrate is exposed in the second region.

The channel layer may be in contact with the exposed portion of the sidewall of the first insulating layer.

Forming the channel layer may include a selective epitaxial growth (SEG) process using the substrate of the second region as a seed.

The method may further include, after forming the gate electrode, removing the first mask layer; forming a bit line buried in the substrate of the first region, the bit line extending in a second direction perpendicular to the first direction to intersect a portion of the active region between the word lines; forming an interlayer insulating layer covering the substrate of the first and second regions; forming contact-vias penetrating the interlayer insulating layer of the first and second regions, respectively; and forming a capacitor connected to the contact-via in the first region.

Embodiments may be realized by providing a semiconductor device, including a substrate; a device isolation layer in the substrate to define an active region; a channel layer on the active region; a gate electrode on the channel layer; and source/drain regions in the active region at both sides of the gate electrode, the device isolation layer including a first insulating layer; a second insulating layer conformally covering the first insulating layer; and a third insulating layer on the second insulating layer, a portion of an upper portion of the second insulating layer being exposed by the first and third insulating layers.

A top surface of the substrate may be higher than topmost surfaces of the first and third insulating layers and may be lower than a topmost surface of the second insulating layer.

The channel layer may include a bottom surface having a first bottom surface in contact with a top surface of the substrate and a second bottom surface in contact with a sidewall of the substrate exposed by the first insulating layer; a top surface opposite to the first bottom surface; and a sidewall connected to one end of the bottom surface and one end of the top surface of the channel layer. The sidewall of the channel layer may include a first sidewall and a second sidewall that meet each other at a first point. The first sidewall may connect the first point to a second point at which the first insulating layer meets a sidewall of the substrate. The second sidewall may connect the one end of the top surface of the channel layer to the first point.

The sidewall of the channel layer may have a corner at the first point.

Embodiments may be realized by providing a method of fabricating a semiconductor device, the method including forming a device isolation layer in a substrate including a first region, a second region, and a third region; forming a first mask layer in the first and third regions to selectively expose the substrate of the second region; and selectively forming a channel layer on the substrate of the second region.

Selectively forming the channel layer on the substrate of the second region may include a selective epitaxial growth (SEG) process.

The method may further include removing the first mask layer of the third region to expose a top surface of the substrate and the device isolation layer of the third region, while retaining the first mask layer of the first region; and simultaneously forming a second gate insulating layer on the substrate of the second region, and a third gate insulating layer on the substrate of the third region.

The method may further include forming a second gate electrode on the second gate insulating layer; and forming a third gate electrode on the third gate insulating layer.

The method may further include forming a second mask layer on the substrate of the first to third regions, the second mask layer having an opening that exposes a portion of the substrate of the first region; and etching the substrate exposed by the opening.

BRIEF DESCRIPTION OF THE DRAWINGS

Features will become apparent to those of skill in the art by describing in detail exemplary embodiments with reference to the attached drawings in which:

FIGS. 7A to 7F illustrate cross-sectional views taken along lines I-I', II-II', and III-III' of FIG. 2 to illustrate a method of fabricating the semiconductor device according to the first embodiment;

DETAILED DESCRIPTION

Figure 1:
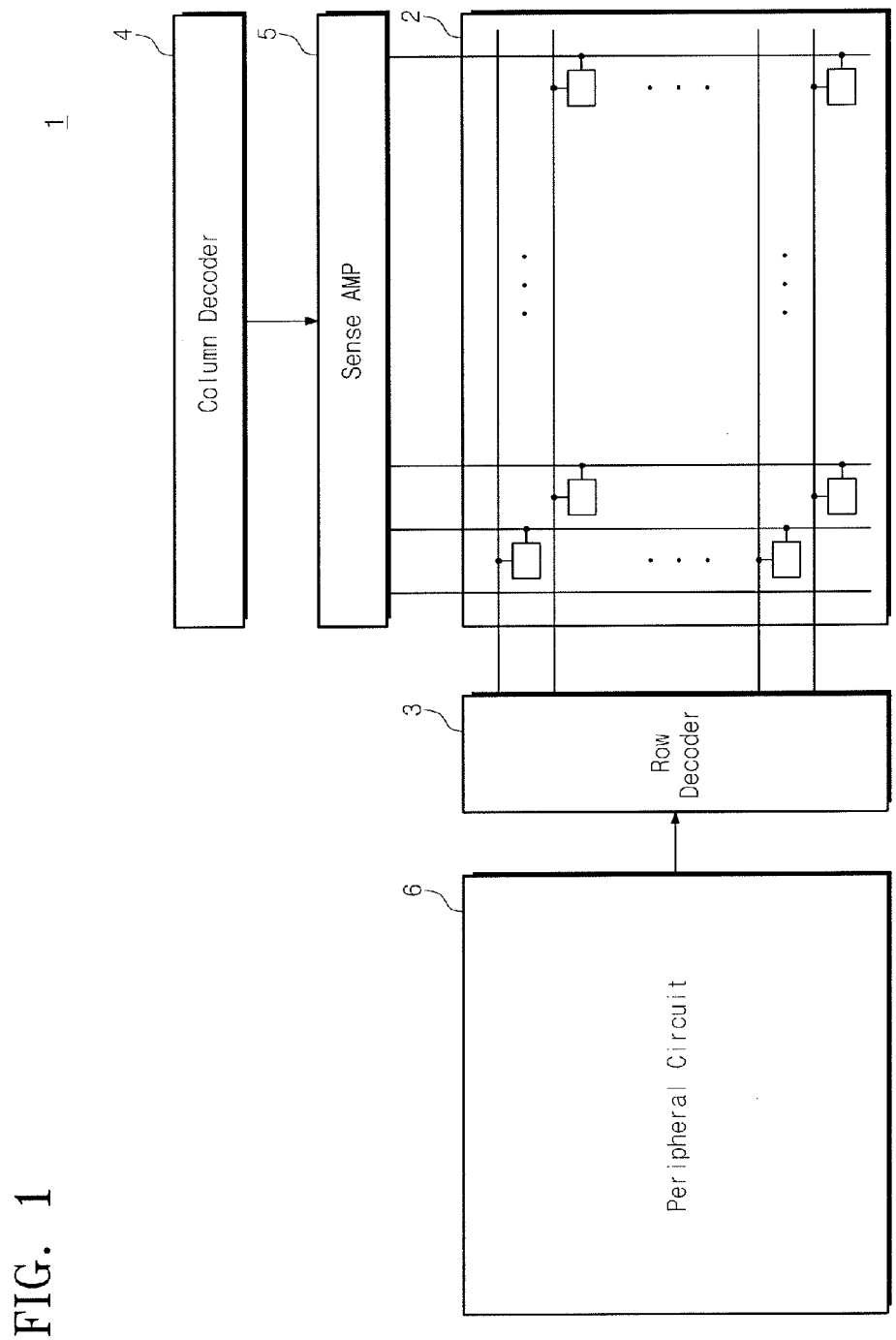
FIG. 1 illustrates a schematic block diagram of a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited.

It will be also understood that although the terms first, second, third etc., may be used herein to describe various elements, these elements should not be limited by these terms. These terms are only used to distinguish one element from another element. Thus, a first element in some embodiments could be termed a second element in other embodiments. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 illustrates a schematic block diagram of a semiconductor device according to example embodiments.

Referring to FIG. 1, a semiconductor device 1 may include a memory cell array 2, a row decoder 3, a column decoder 4, a sense amplifying part 5, and a peripheral circuit part 6. The memory cell array 2 may include a plurality of memory cells. One memory cell may include one switching element and one storage element (e.g., a capacitor). The storage element may be filled with charges to store data. The row decoder 3 may drive a row of the memory cell array 2, and the column decoder 4 may drive a column of the memory cell array 2. The sense amplifying part 5 may sense and amplify data. The sense amplifying part 5 may sense and amplify a difference between a reference voltage and a voltage generated by charges stored in the storage element, thereby reading data. The peripheral circuit part 6 may have a function that drives the memory cell array 2 and/or performs a refresh operation.

Figure 2:
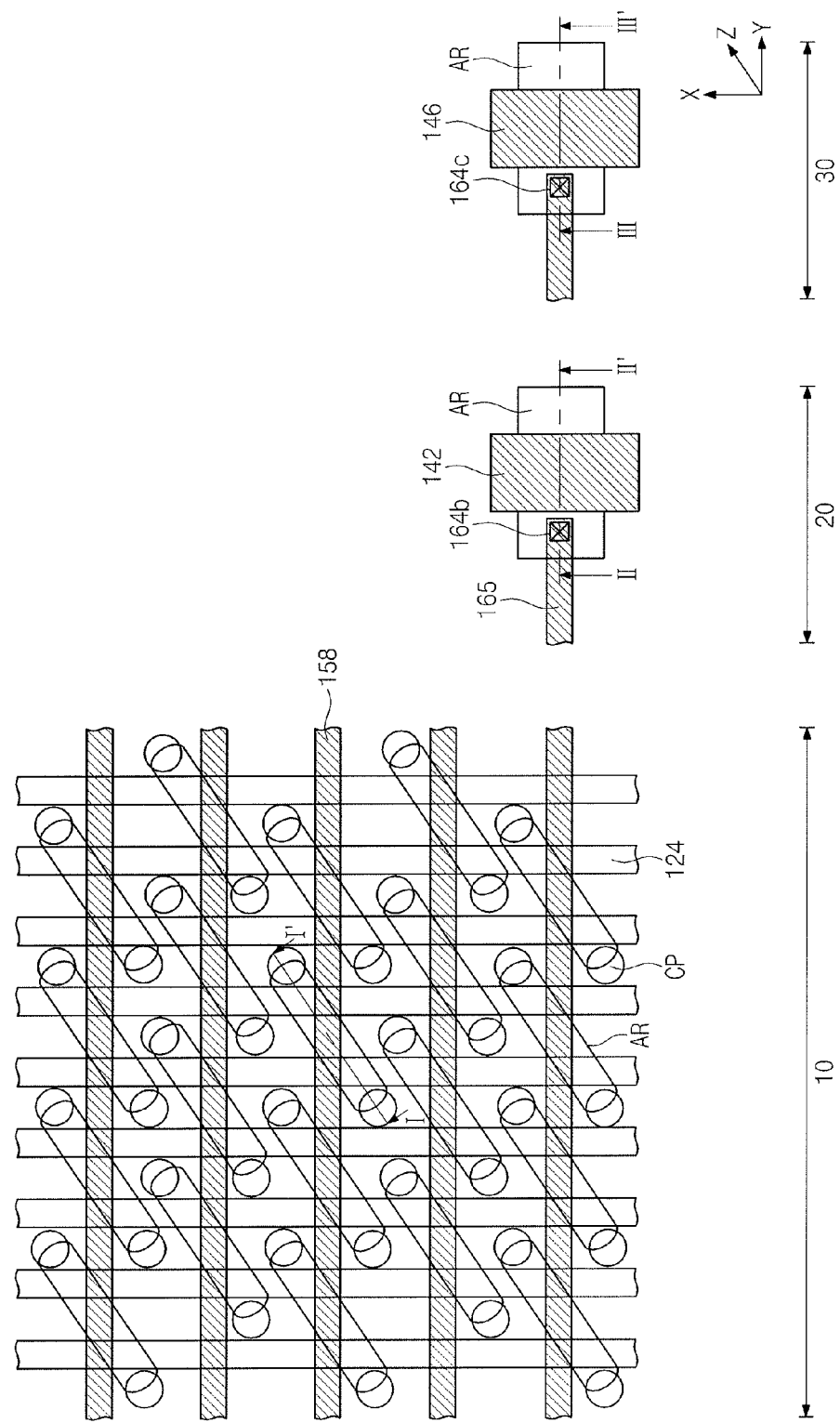
FIG. 2 illustrates a plan view of a semiconductor device according to example embodiments.
Figure 3:
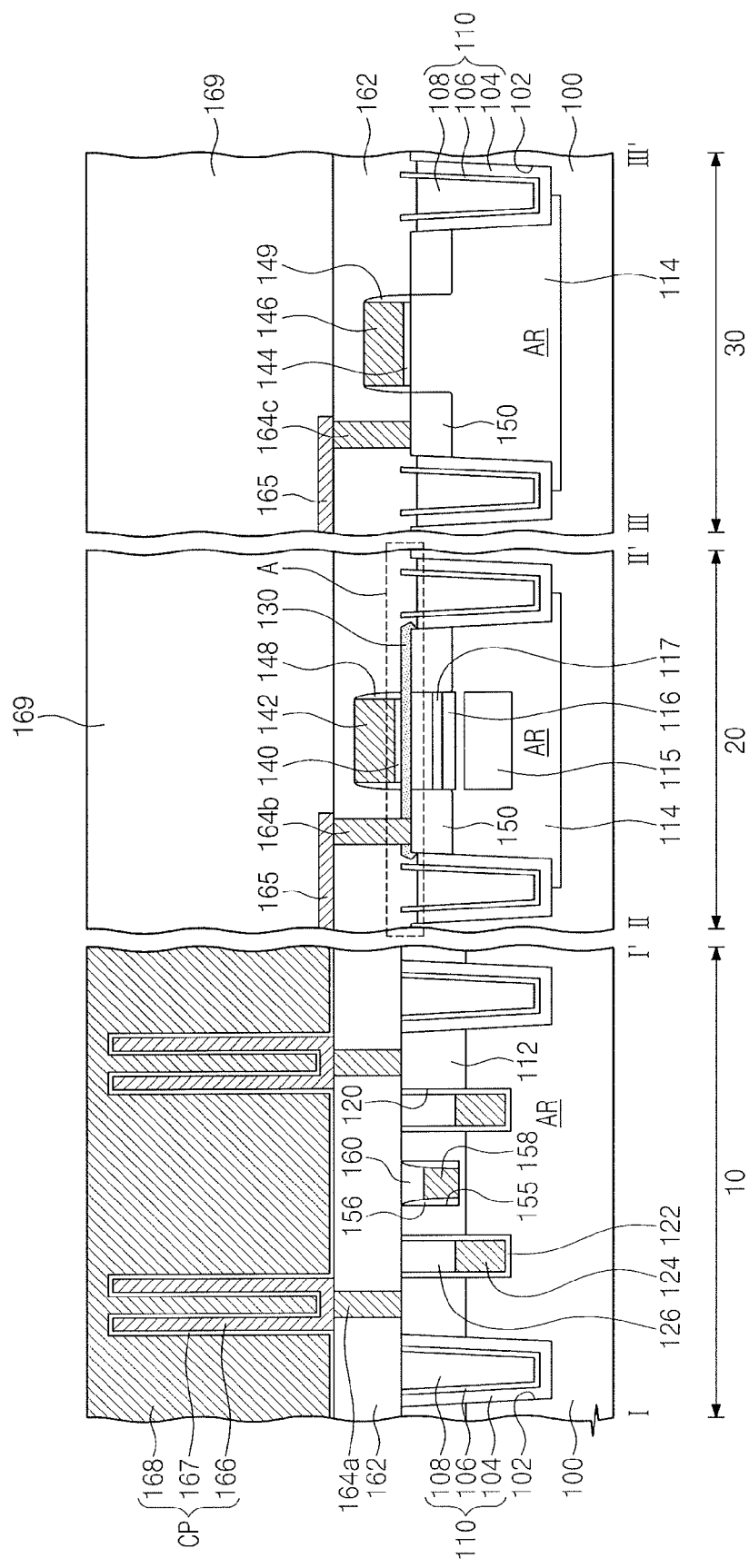
FIG. 3 illustrates a cross-sectional view taken along lines I-I', II-II', and III-III' of FIG. 2 to illustrate a semiconductor device according to a first embodiment.
Figure 4:
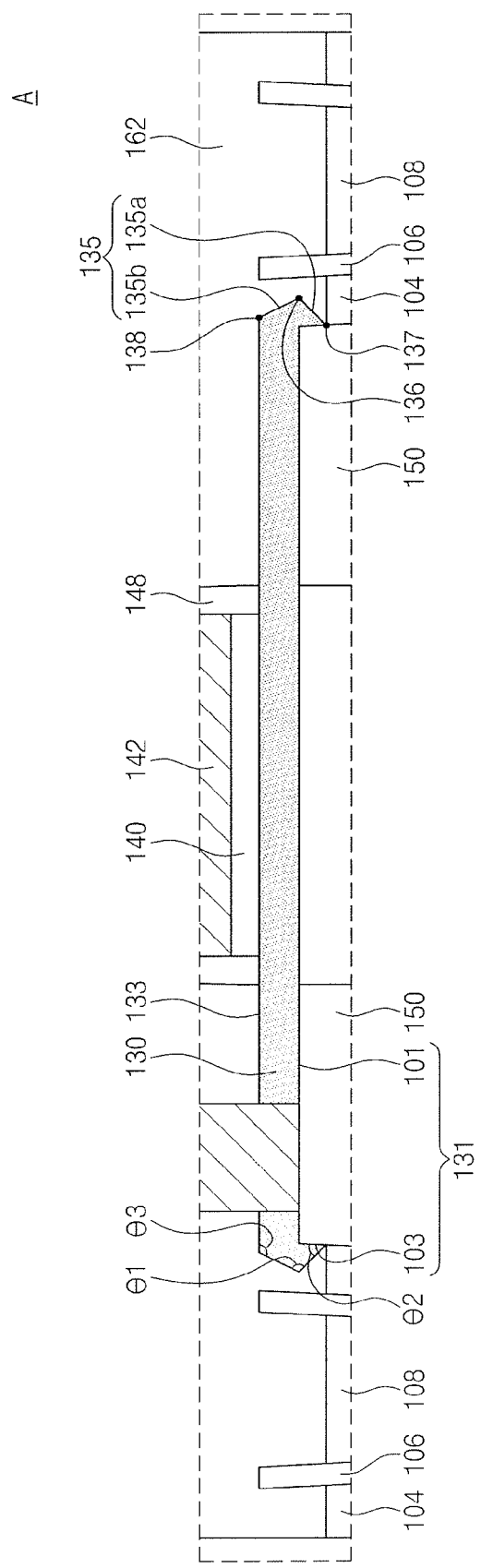
FIG. 4 illustrates an enlarged view of a portion 'A' of FIG. 3.

FIG. 2 illustrates a plan view of a semiconductor device according to example embodiments. FIG. 3 illustrates a cross-sectional view taken along lines I-I', II-II', and III-III' of FIG. 2 to illustrate a semiconductor device according to a first embodiment. FIG. 4 illustrates an enlarged view of a portion 'A' of FIG. 3.

Referring to FIGS. 2 and 3, a device isolation layer 110 may be disposed in a substrate 100 including a first region 10, a second region 20, and a third region 30. The first region 10 may be a cell region. The second region 20 may be a first peripheral circuit region, and the third region 30 may be a second peripheral circuit region. In some embodiments, the second region 20 may be a word line driver region, a sense amplifying part region, a row region, or a column region. For example, the second region 20 may be the sense amplifying part region. The third region 30 may be one of the word line driver region, the sense amplifying part region, the row region, or the column region. The substrate 100 may be a bulk silicon substrate, a silicon-on-insulator (SOI) substrate, a germanium substrate, a germanium-on-insulator (GOI) substrate, a silicon-germanium substrate, or a substrate including an epitaxial layer formed by performing a selective epitaxial growth (SEG) process.

The device isolation layer 110 may define active regions AR of the substrate 100. The active region AR of the first region 10 may have a bar shape extending in one direction Z when viewed from a plan view. A plurality of active regions AR may be provided in the first region 10 and the active regions AR of the first region 10 may be parallel to each other.

The device isolation layer 110 may fill a device isolation trench 102 that is formed by recessing a top surface of the substrate 100. The device isolation layer 110 may include a first insulating layer 104 conformally covering an inner surface of the device isolation trench 102, a second insulating layer 106 conformally formed on the first insulating layer 104, and a third insulating layer 108 filling the device isolation trench 102 on the second insulating layer 106. Each of the first to third insulating layers 104, 106, and 108 may include at least one of a silicon oxide layer, a silicon nitride layer, or a silicon oxynitride layer. The first insulating layer 104 and the third insulating layer 108 may include the same material. The second insulating layer 106 may include an insulating material having an etch selectivity with respect to the first and third insulating layers 104 and 108. For example, if the first and third insulating layers 104 and 108 are silicon oxide layers, the second insulating layer 106 may be a silicon nitride layer.

A top surface of the device isolation region 110 in the first region 10 of the substrate 100 may be disposed at the substantially same level as the top surface of the substrate 100. In the first region 10, a top surface of the third insulating layer 108 of the device isolation layer 110 may be substantially coplanar with topmost surfaces of the first and second insulating layers 104 and 106.

Top surfaces of the device isolation layers 110 in the second and third regions 20 and 30 of the substrate 100 may be disposed at a different level from the top surface of the substrate 100. The top surface of the substrate 100 may be higher than a topmost surface of the first insulating layer 104 and a top surface of the third insulating layer 108 in each of the second and third regions 20 and 30, and a portion of a sidewall, which is adjacent to the first insulating layer 104, of the substrate 100 may be exposed in each of the second and third regions 20 and 30.

A topmost surface of the second insulating layer 106 may be higher than the top surface of the substrate 100 in each of the second and third regions 20 and 30, and an upper portion of the second insulating layer 106 may be exposed by the first and third insulating layers 104 and 108 in each of the second and third regions 20 and 30.

Dopant regions may be formed in the active regions AR of the substrate 100. First dopant regions 112 may be formed in the active regions AR of the first region 10. The first dopant regions 112 may be source/drain regions. A second dopant region 114 may be formed in the active region AR of each of the second and third regions 20 and 30. A depth of a bottom surface of the second dopant region 114 from the top surface of the substrate 100 may be deeper than that of a bottom surface of the first dopant region 112. The second dopant region 114 may be a well region.

A third dopant region 115, a fourth dopant region 116, and a fifth dopant region 117 may be sequentially formed in the active region AR of the second region 20. The third to fifth dopant regions 115, 116, and 117 may be formed in the second dopant region 114 of the second region 20. The top surface of the substrate 100 may be closer to the fifth dopant region 117 than to the fourth region 116. In some embodiments, the fifth dopant region 117 may be disposed between the fourth dopant region 116 and the top surface of the substrate 100. The top surface of the substrate 100 may be closer to the fourth dopant region 116 than to the third dopant region 115. In some embodiments, the fourth dopant region 116 may be disposed between the third dopant region 115 and the top surface of the substrate 100. The third dopant region 115 may be an anti-punch-through (APT) region, the fourth dopant region 116 may be a screen region, and the fifth dopant region 117 may be a diffusion prevention region. The fourth dopant region 116 may have a function that screens an electric field generated from a gate electrode formed on the substrate 100 of the second region 20 when a threshold voltage or a voltage greater than the threshold voltage is applied to the gate electrode. The fifth dopant region 117 may have a function that prevents dopants (e.g., boron) included in the fourth dopant region 116 from being diffused to an upper portion, disposed on the fifth dopant region 117, of the substrate 100 and/or a structure disposed on the substrate 100. A dopant concentration of the fourth dopant region 116 may be higher than those of the third and fifth dopant regions 115 and 117.

A buried word line 124 may be in the first region 10 of the substrate 100. The buried word line 124 may partially fill a word line trench 120 that is formed by etching the substrate 100. The buried word line 124 may correspond to a first gate electrode formed in the first region 10. The buried word line 124 may extend in a first direction X to intersect the active region AR. Two buried word lines 124 may intersect one active region AR and may be spaced apart from each other. A first filling insulation pattern 126 may be on the buried word line 124. A first gate insulating layer 122 may be between the buried word line 124 and an inner surface of the word line trench 120. The first gate insulating layer 122 may conformally cover the inner surface of the word line trench 120.

A buried bit line 158 may be in the first region 10 of the substrate 100. The buried bit line 158 may extend in a second direction X perpendicular to the first direction X to intersect the active region AR. The buried bit line 158 may intersect the active region AR disposed between the two buried word lines 124. The buried bit line 158 may partially fill a bit line trench 155 that is formed, e.g., by etching the substrate 100. A portion of the buried bit line 158 may be in the first dopant region 112. A second filling insulation pattern 160 may be on the buried bit line 158. A third spacer 156 may be between the substrate 100 and the buried bit line 158. The third spacer 156 may be between each sidewall of the buried bit line 158 and each inner sidewall of the bit line trench 155.

A channel layer 130 may be on the substrate 100 of the second region 20. As illustrated in FIG. 4, the channel layer 130 may include a bottom surface 131, a top surface 133, and a sidewall 135. The bottom surface 131 of the channel layer 130 may include a first bottom surface 101 in contact with the top surface of the substrate 100 and a second bottom surface 103 in contact with the sidewall, exposed by the first insulating layer 104, of the substrate 100. The reference numeral 101 may also correspond to the top surface of the substrate 100, and the reference numeral 103 may also correspond to the exposed sidewall of the substrate 100. The top surface 133 of the channel layer 130 may be opposite to the first bottom surface 101 of the channel layer 130. A top end and a bottom end of the sidewall 135 of the channel layer 130 may be connected to one end of the top surface 133 and one end of the bottom surface 131, respectively. The bottom surface 131 of the channel layer 130 may be higher than the topmost surface of the first insulating layer 104 and the top surface of the third insulating layer 108. The sidewall 135 may include a first sidewall 135a and a second sidewall 135b. The first sidewall 135a and the second sidewall 135b may meet each other at a first point 136. The first sidewall 135a may be a first inclined surface that connects the first point 136 to a second point 137 at which the second bottom surface 103 of the channel layer 130 meets the first insulating layer 104. The second sidewall 135b may be a second inclined surface that connects the first point 136 to a third point 138 at which the top surface 133 meets the sidewall 135. The sidewall 135 of the channel layer 130 may have a corner at the first point 136. A first angle θ1 between the first and second sidewalls 135a and 135b may be greater than 0 degrees and less than 180 degrees (0°<θ1<180°). A second angle θ2 between the first sidewall 135a and the sidewall 103 of the substrate 100 (i.e., the second bottom surface 103 of the channel layer 130) may be greater than 0 degrees and less than 90 degrees (0°<θ2<90°). A third angle θ3 between the second sidewall 135b and the top surface 133 of the channel layer 130 may be greater than 0 degrees and less than 180 degrees (0°<θ3<180°).

The channel layer 130 may be formed by a selective epitaxial growth (SEG) process using the substrate 100 as a seed. If the substrate 100 is formed of single-crystalline silicon, the channel layer 130 may be a single-crystalline silicon layer. The channel layer 130 may be formed of a semiconductor material of which a conductivity type is the same as that of the substrate 100. In an embodiment, the channel layer 130 may be formed of an intrinsic semiconductor material. For example, if the substrate 100 is formed of a P-type semiconductor material, the channel layer 130 may be formed of a P-type semiconductor material or an intrinsic semiconductor material.

Referring again to FIGS. 2 and 3, a second gate insulating layer 140 and a second gate electrode 142 may be sequentially stacked on the channel layer 130. The second gate insulating layer 140 and the second gate electrode 142 may be formed on the active region AR of the second region 20. First spacers 148 may be on both sidewalls of the second gate electrode 142. Sixth dopant regions 150 may be in the active region AR at both sides of the second gate electrode 142 in the second region 20. The sixth dopant region 150 may be adjacent to the fifth dopant region 117 in the second dopant region 114. The sixth dopant region 150 may be a source/drain region.

A third gate insulating layer 144 and a third gate electrode 146 may be sequentially stacked on the substrate 100 of the third region 30. The third gate insulating layer 144 and the third gate electrode 146 may be on the active region AR of the third region 30. Second spacers 149 may be on both sidewalls of the third gate electrode 146. Sixth dopant regions 150 may be disposed in the active region AR at both sides of the third gate electrode 146 in the third region 30. The sixth dopant region 150 may be formed in the second dopant region 114 in the third region 30. The sixth dopant region 150 of the third region 30 may be a source/drain region.

A first interlayer insulating layer 162 may be disposed on an entire top surface of the substrate 100. First, second, and third contact-vias 164a, 164b, and 164c may penetrate the first interlayer insulating layer 162 of the first, second, and third regions 10, 20, and 30, respectively. The first to third contact-vias 164a, 164b, and 164c may be disposed on edge regions of the active regions AR of the first to third regions 10, 20, and 30, respectively. The first contact-via 164a of the first region 10 may be electrically connected to the first dopant region 112 disposed between the buried word line 124 and the device isolation layer 110 adjacent to the buried word line 124. The second contact-via 164b of the second region 20 may further penetrate the channel layer 130 so as to be electrically connected to the sixth dopant region 150 of the second region 20. The third contact-via 164c of the third region 30 may be electrically connected to the sixth dopant region 150 of the third region 30. Silicide layers may be at interfaces between the substrate 100 and the contact-vias 164a, 164b, and 164c.

In an embodiment, a conductive line 165 may be in each of the second and third regions 20 and 30. In an embodiment, the conductive lines 165 may be on the first interlayer insulating layer 162 and may be electrically connected to the second and third contact-vias 164b and 164c. In an embodiment, the conductive line 165 in the second region 20 may be electrically connected to the buried bit line 158.

A capacitor CP may be on the first interlayer insulating layer 162 of the first region 10. The capacitor CP may include a first electrode 166, a dielectric layer 167, and a second electrode 168 covering the first electrode 166 and the dielectric layer 167. The first electrode 166 may have a cylindrical shape. The dielectric layer 167 may conformally cover the first electrode 166.

A second interlayer insulating layer 169 may be on the first interlayer insulating layer 162 of the second and third regions 20 and 30. The second interlayer insulating layer 169 may cover the conductive lines 165.

Figure 5:
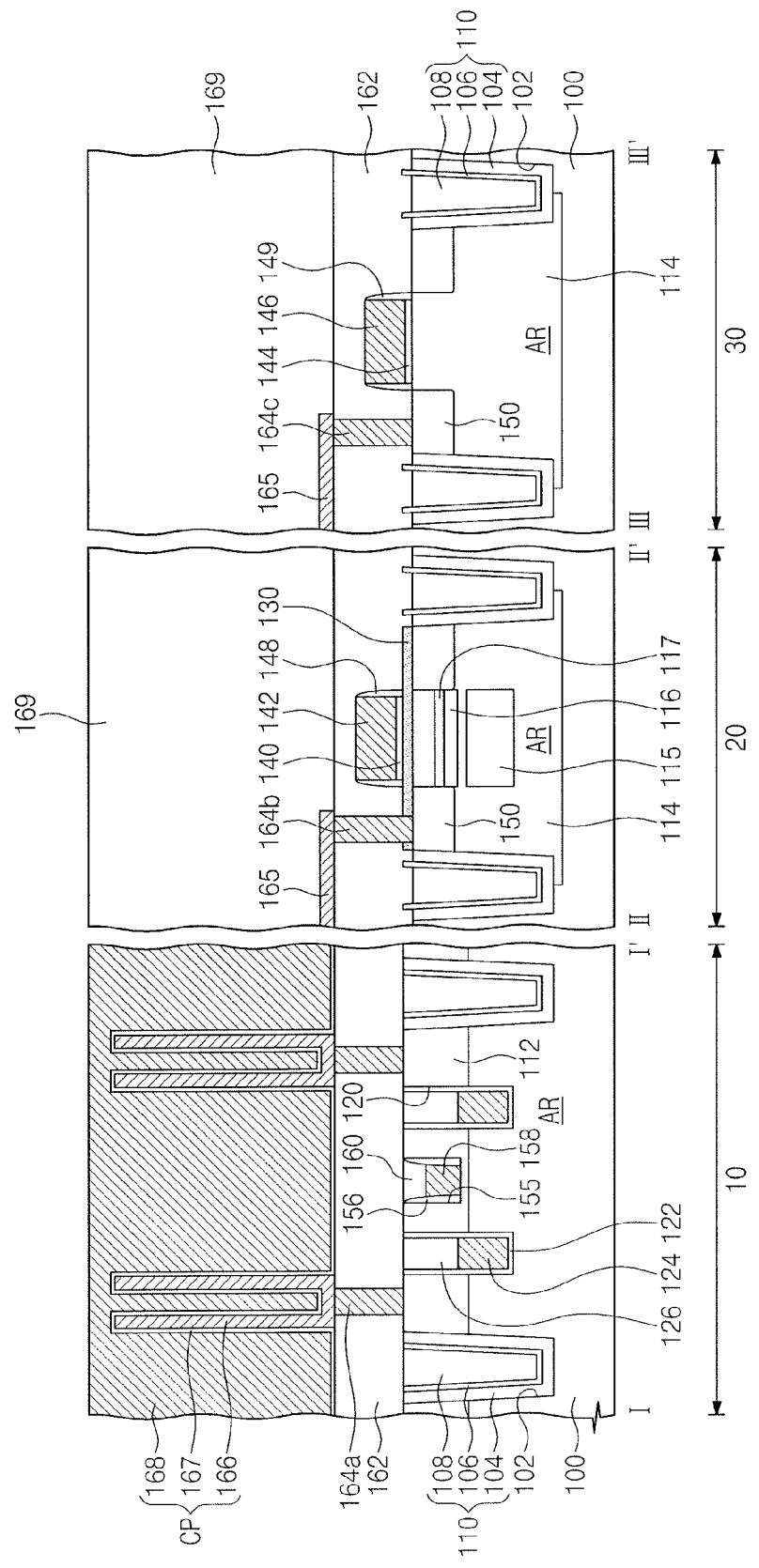
FIG. 5 illustrates a cross-sectional view taken along lines I-I', II-II', and III-III' of FIG. 2 to illustrate a semiconductor device according to a second embodiment.

FIG. 5 illustrates a cross-sectional view taken along lines I-I', II-II', and III-III' of FIG. 2 to illustrate a semiconductor device according to a second embodiment. In the present embodiment, the same element as described in the first embodiment will be indicated by the same reference numerals or the same reference designators. Hereinafter, the descriptions to the same elements as in the first embodiment will be omitted or mentioned briefly for the purpose of ease and convenience in explanation.

Referring to FIG. 5, a top surface of the substrate 100 of second and third regions 20 and 30 may be at the substantially same level as the topmost surface of the first insulating layer 104 and the top surface of the third insulating layer 108. In each of the second and third regions 20 and 30, the topmost surface of the second insulating layer 106 may be higher than the topmost surface of the first insulating layer 140 and the top surface of the third insulating layer 108, and a portion of the upper portion of the second insulating layer 106 may be exposed by the first and third insulating layers 104 and 108.

The channel layer 130 may be on the substrate 100 (i.e., the active region AR) of the second region 20. The channel layer 130 may cover the top surface of the active region AR of the second region 20. A bottom surface 131 of the channel layer 130 may be at the same level as the topmost surface of the first insulating layer 104 and the top surface of the third insulating layer 108. The channel layer 130 may be formed, e.g., by a SEG process using the substrate 100 as a seed.

Figure 6:
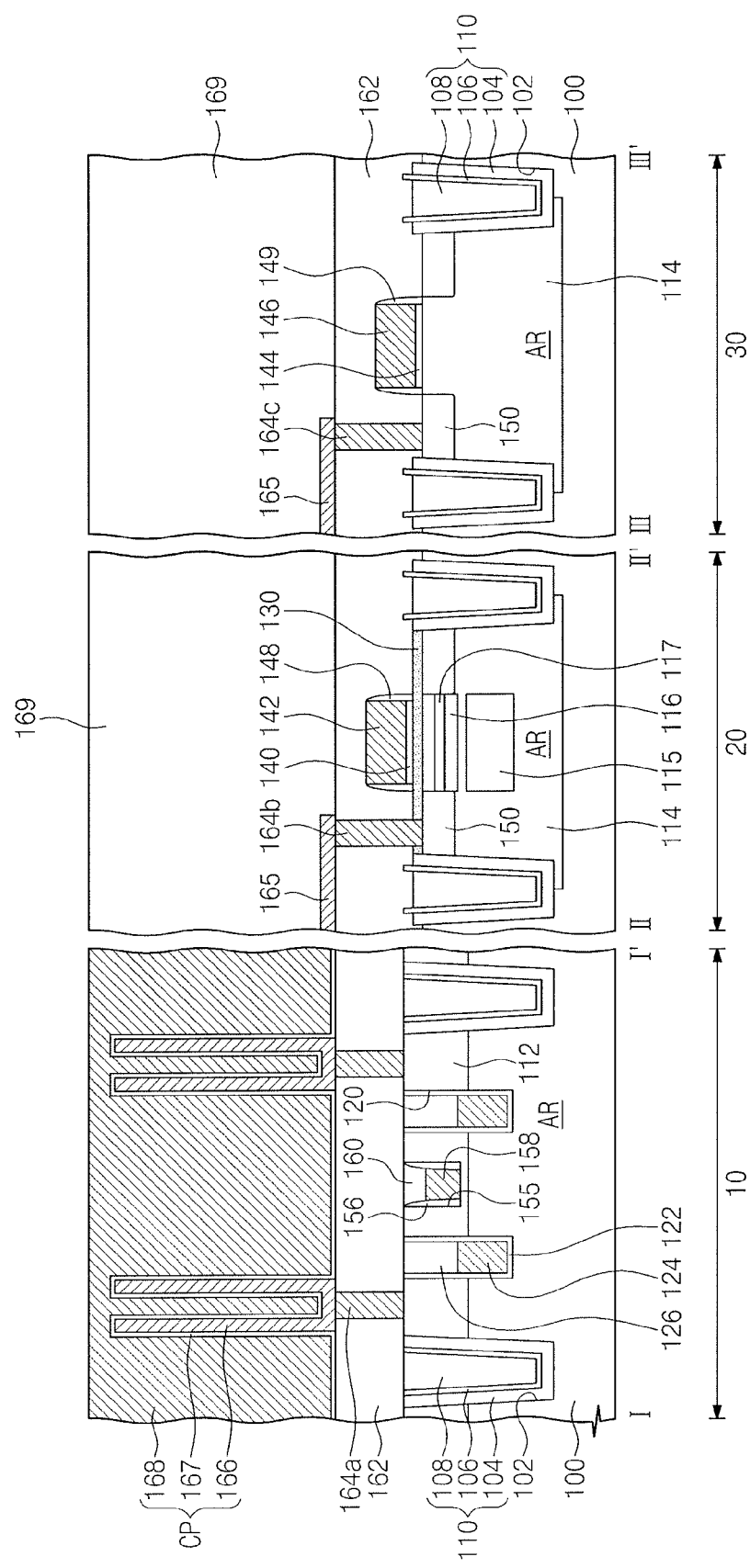
FIG. 6 illustrates a cross-sectional view taken along lines I-I', II-II', and III-III' of FIG. 2 to illustrate a semiconductor device according to a third embodiment.

FIG. 6 illustrates a cross-sectional view taken along lines I-I', II-II', and III-III' of FIG. 2 to illustrate a semiconductor device according to a third embodiment. In the present embodiment, the same element as described in the first embodiment will be indicated by the same reference numerals or the same reference designators. Hereinafter, the descriptions to the same elements as in the first embodiment will be omitted or mentioned briefly for the purpose of ease and convenience in explanation.

Referring to FIG. 6, a top surface of the substrate 100 may be lower than the topmost surface of the first insulating layer 104 and the top surface of the third insulating layer 108 in each of the first and second regions 20 and 30, and a portion of a sidewall of the first insulating layer 104, which is adjacent to the top surface of the substrate 100, may be exposed by the substrate 100. The topmost surface of the second insulating layer 106 may be higher than the topmost surface of the first insulating layer 104 and the top surface of the third insulating layer 108, and the portion of the upper portion of the second insulating layer 106 may be exposed by the first and third insulating layers 104 and 108.

A channel layer 130 may be on the substrate 100 (i.e., the active region AR) of the second region 20. The channel layer 130 may cover the top surface of the active region AR of the second region 20. A bottom surface 131 of the channel layer 130 may be lower than the topmost surface of the first insulating layer 104 and the top surface of the third insulating layer 108. The channel layer 130 may be formed by a SEG process using the substrate 100 as a seed.

FIGS. 7A to 7F illustrate cross-sectional views taken along lines I-I', II-II', and III-III' of FIG. 2 to illustrate a method of fabricating the semiconductor device according to the first embodiment.

Figure 7A:
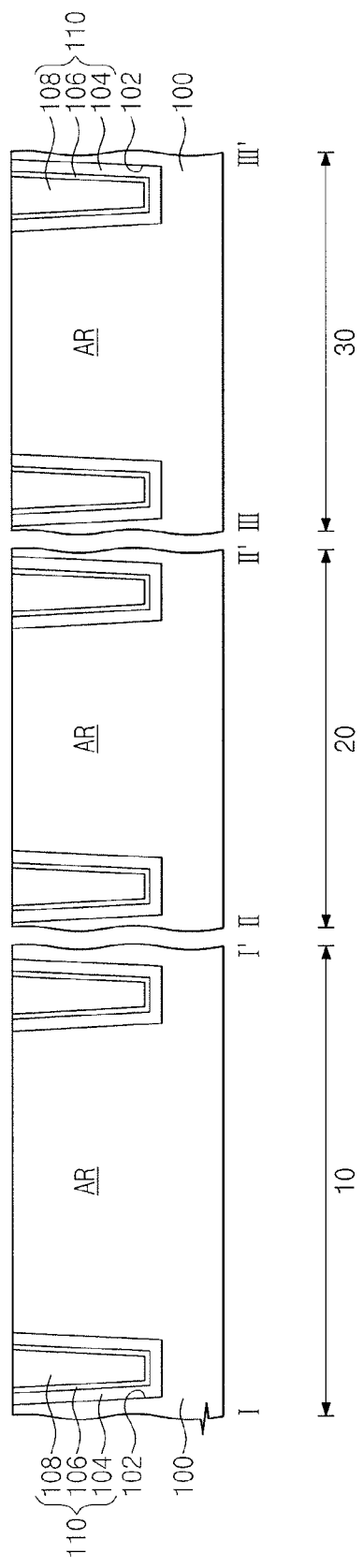

Referring to FIGS. 2 and 7A, a device isolation layer 110 may be formed in a substrate 100 to define active regions AR. The substrate 100 may include a first region 10, a second region 20, and a third region 30. The active region AR of the first region 10 may have a bar shape extending in one direction Z. The active region AR may be provided in plurality in the first region 10 and the active regions AR may be parallel to each other. The first region 10 may be a cell region. The second region 20 may be a first peripheral circuit region, and the third region 30 may be a second peripheral circuit region. In some embodiments, the second region 20 may be a word line driver region, a sense amplifying part region, a row region, or a column region. For example, the second region 20 may be the sense amplifying part region. In some embodiments, the substrate 100 may be etched to form a device isolation trench 102, and the device isolation trench 102 may be filled with an insulating material to form the device isolation layer 110. The third region 30 may be one of the word line driver region, the sense amplifying part region, the row region, or the column region.

The device isolation layer 110 may include a first insulating layer 104, a second insulating layer 106, and a third insulating layer 108. The first insulating layer 104 may conformally cover an inner surface of the device isolation trench 102. The second insulating layer 106 may be conformally formed on the first insulating layer 104. The third insulating layer 108 may be formed on the second insulating layer 106. The third insulating layer 108 may cover the second insulating layer 106 and may fill the device isolation trench 102. The top surface of the substrate 100 may be disposed at the substantially same level as a top surface of the device isolation layer 110.

Each of the first to third insulating layers 104, 106, and 108 may include at least one of a silicon oxide layer, a silicon nitride layer, or a silicon oxynitride layer. The first insulating layer 104 and the third insulating layer 108 may include the same material. The second insulating layer 106 may include an insulating material having an etch selectivity with respect to the first and third insulating layers 104 and 108. For example, if the first and third insulating layers 104 and 108 are formed of silicon oxide layers, the second insulating layer 106 may be formed of a silicon nitride layer.

Figure 7B:
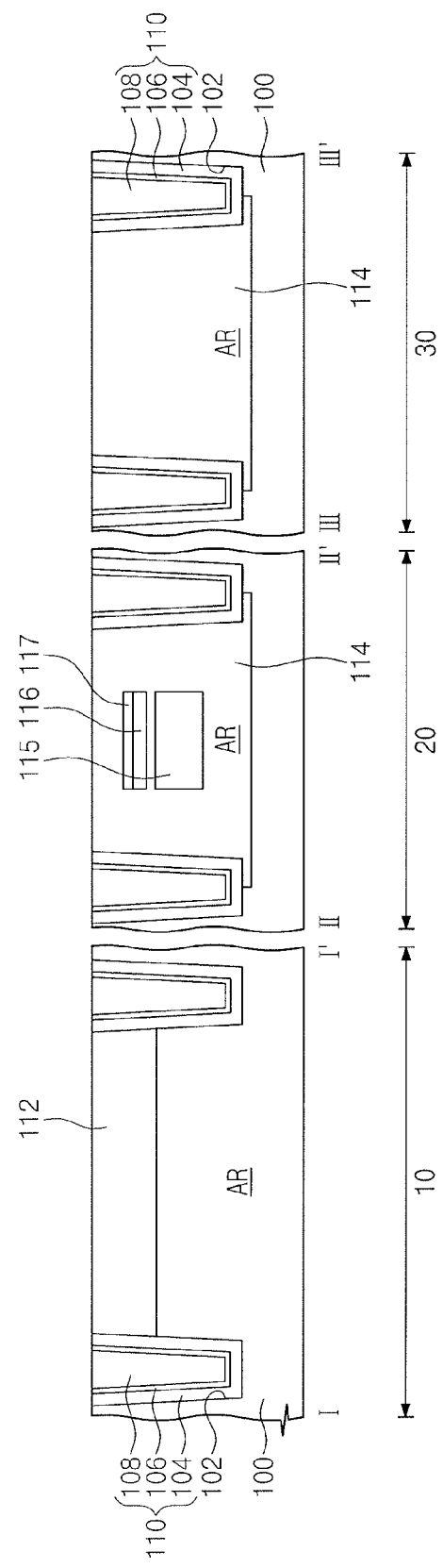

Referring to FIGS. 2 and 7B, dopant regions may be formed in the substrate 100. A first dopant region 112 may be formed in the substrate 100 (i.e., the active region AR) of the first region 10. A second dopant region 114 deeper than the first dopant region 112 may be formed in the substrate 100 (i.e., the active region AR) of each of the second and third regions 20 and 30. The first dopant region 112 may be a source/drain region. The second dopant region 114 may be a well region.

After formation of the second dopant region 114 of the second region 20, a third dopant region 115, a fourth dopant region 116, and a fifth dopant region 117 may be sequentially formed in the substrate 100 (i.e., the active region AR) of the second region 20. The third to fifth dopant regions 115, 116, and 117 may be formed in the second dopant region 114 of the second region 20. The top surface of the substrate 100 may be closer to the fifth dopant region 117 than to the fourth region 116. In some embodiments, the fifth dopant region 117 may be formed between the fourth dopant region 116 and the top surface of the substrate 100. The top surface of the substrate 100 may be closer to the fourth dopant region 116 than to the third dopant region 115. In some embodiments, the fourth dopant region 116 may be formed between the third dopant region 115 and the top surface of the substrate 100. The fourth dopant region 116 may be formed between the third dopant region 115 and the fifth dopant region 117.

Referring to FIGS. 2 and 7C, a buried word line 124 may be formed in the substrate 100 of the first region 10. A portion of the top surface of the substrate 100 may be recessed to form a word line trench 120. The word line trench 120 may be deeper than the first dopant region 112. The word line trench 120 may extend in a first direction X to intersect the active region AR in the first region 10 when viewed from a plan view. Two word line trenches 120 may intersect one active region AR in the first region 10. A first gate insulating layer 122 may be conformally formed on an inner surface of the word line trench 120. Thereafter, the buried word line 124 may be formed to fill a lower region of the word line trench 120, and a first filling insulation pattern 126 may be formed to fill the word line trench 120 on the buried word line 124. The first gate insulating layer 122 may be formed of, for example, a silicon oxide layer. For example, the buried word line 124 may be formed of at least one of poly-silicon, metal materials, or metal silicide materials. The first filling insulation pattern 126 may include at least one of silicon oxide, silicon nitride, or silicon oxynitride.

Etching processes for forming the word line trench 120, the first gate insulating layer 122, the buried word line 124, and the first filling insulation pattern 126 may be performed on the substrate 100 of the first region 10, and portions of the substrate 100 and the device isolation layer 110 of the second and third regions 20 and 30 may also be etched by the etching processes performed on the substrate 100 of the first region 10.

In some embodiments, the first and third insulating layers 104 and 108 of the second and third regions 20 and 30 may be etched more than the substrate 100 of the second and third regions 20 and 30, and, in each of the second and third regions 20 and 30, a top surface of the substrate 100 may be higher than a topmost surface of the first insulating layer 104 and a top surface of the third insulating layer 108. A portion of a sidewall of the substrate 100 adjacent to the first insulating layer 104 may be exposed.

Since the second insulating layer 106 includes the insulating material having an etch selectivity with respect to the first and third insulating layers 104 and 108, the second insulating layer 106 of the second and third regions 20 and 30 may not be etched by the above etching processes or an etched amount of the second insulating layer 106 of the second and third regions 20 and 30 may be less than those of the first and third insulating layers 104 and 108 of the second and third regions 20 and 30. In each of the second and third regions 20 and 30, a topmost surface of the second insulating layer 106 may be higher than the top surface of the substrate 100, the topmost surface of the first insulating layer 104, and the top surface of the third insulating layer 108. A portion of an upper portion of the second insulating layer 106 may be exposed by the first and third insulating layers 104 and 108 in each of the second and third regions 20 and 30.

Figure 7D:
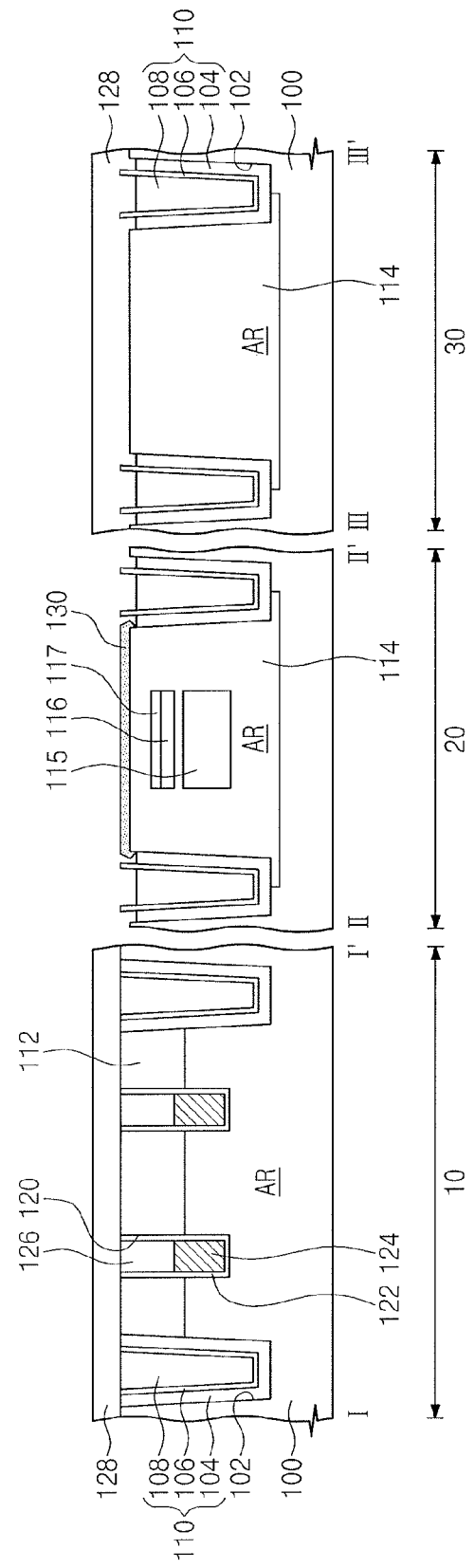

Referring to FIGS. 2 and 7D, a first mask layer 128 may be formed on the substrate 100 of the first and third regions 10 and 30. The first mask layer 128 of the first region 10 may cover the substrate 100, the device isolation layer 110, the first gate insulating layer 122, and the first filling insulation pattern 126. The first mask layer 128 of the third region 30 may cover the substrate 100 and the device isolation layer 110. The first mask layer 128 may be formed of, for example, a silicon nitride layer or a silicon oxynitride layer.

The substrate 100 of the second region 20 may be exposed by the first mask layer 128. Silicon of the exposed surface of the substrate 100 may act with oxygen included in the atmosphere to form a natural oxide layer. The natural oxide layer may be, for example, a silicon oxide layer. The natural oxide layer may be removed by a wet etching process or a dry etching process. A channel layer 130 may be formed on the surface of the substrate 100 exposed by the first mask layer 128.

The channel layer 130 may be grown from the exposed surface of the substrate 100 by a SEG process using the substrate 100 as a seed. If the substrate 100 is formed of single-crystalline silicon, the channel layer 130 may be formed of a single-crystalline silicon layer. The channel layer 130 may have the same conductivity type as the substrate 100. In an embodiment, the channel layer 130 may be in an intrinsic state. For example, if the substrate 100 is formed of a P-type semiconductor material, the channel layer 130 may be formed of a P-type semiconductor material or an intrinsic semiconductor material.

Referring again to FIG. 4, the surface of the substrate 100 exposed by the first mask layer 128 may include the top surface of the substrate 100 and the sidewall of the substrate 100 exposed by the first insulating layer 104. A crystal plane of the top surface of the substrate 100 may be different from a crystal plane of the sidewall of the substrate 100. For example, the top surface of the substrate 100 may have a (100) plane, and the sidewall of the substrate 100 may have a (110) plane. The channel layer 130 formed by the SEG process may include a first surface having a (100) plane grown from the top surface of the substrate 100 and a second surface having a (110) plane grown from the sidewall of the substrate 100. In other words, the channel layer 130 having tow crystal planes may be formed.

The channel layer 130 may include the bottom surface 131, the top surface 133, and the sidewall 135. The bottom surface 131 of the channel layer 130 may include the first bottom surface 101 in contact with the top surface of the substrate 100 and the second bottom surface 103 in contact with the sidewall of the substrate 100 exposed by the first insulating layer 104. The top surface 133 of the channel layer 130 may be opposite to the first bottom surface 101 of the channel layer 130. The sidewall 135 of the channel layer 130 may be connected to one end of the top surface 133 and one end of the bottom surface 131, respectively. The bottom surface 131 of the channel layer 130 may be higher than the topmost surface of the first insulating layer 104 and the top surface of the third insulating layer 108 in the second region 20. The sidewall 135 may include the first sidewall 135a and the second sidewall 135b. The first sidewall 135a and the second sidewall 135b may have crystal planes different from each other. The first sidewall 135a and the second sidewall 135b may meet each other at the first point 136. The first sidewall 135a may be the first inclined surface that connects the first point 136 to the second point 137 at which the second bottom surface 103 of the channel layer 130 meets the first insulating layer 104. The second sidewall 135b may be the second inclined surface that connects the first point 136 to the third point 138 at which the top surface 133 meets the sidewall 135. The sidewall 135 of the channel layer 130 may have a corner disposed at the first point 136. The first angle θ1 between the first and second sidewalls 135a and 135b may be greater than 0 degrees and less than 180 degrees (0°<θ1<180°). The second angle θ2 between the first sidewall 135a and the sidewall 103 of the substrate 100 (i.e., the second bottom surface 103 of the channel layer 130) may be greater than 0 degrees and less than 90 degrees (0°<θ2<90°). The third angle θ3 between the second sidewall 135b and the top surface 133 of the channel layer 130 may be greater than 0 degrees and less than 180 degrees (0°<θ3<180°).

The sense amplifying part may include a sense amplifier. The sense amplifier may include a pair of p-channel or p-type metal oxide semiconductor (PMOS) transistors and a pair of n-channel or n-type metal oxide semiconductor (NMOS) transistors. In the sense amplifier, threshold voltages of the pair of PMOS (or NMOS) transistors may be uniformly maintained and a difference between the threshold voltages of the pair of PMOS (or NMOS) transistors may be minimized. The channel layer 130, which is undoped or lightly doped, may be formed on the substrate 100 to maintain uniform threshold voltages and/or to minimize the threshold voltage difference, and a high-concentration dopant region (e.g., a halo region), that may cause random dopant fluctuation (RDF) in the substrate 100, may be omitted.

In a dynamic random access memory (DRAM) device, a gate electrode of the cell region may be buried in a substrate after formation of a device isolation layer, and forming the channel layer in the cell region may be difficult. Availability of the channel layer in the cell region may be less than that of the channel layer in the sense amplifying part.

According to embodiments, the first mask layer 128 may be formed in the first and third regions 10 and 30 to selectively expose the substrate 100 of the second region 20, and the channel layer 130 may be selectively formed in the sense amplifying part. The channel layer 130 may be selectively formed on the substrate 100 of the second region 20 by the SEG process. As a result, the channel layer 130 may be selectively formed in only the sense amplifying part on the same wafer during the fabrication of the DRAM device, so performance of the sense amplifier of the DRAM device may be improved.

Figure 7E:
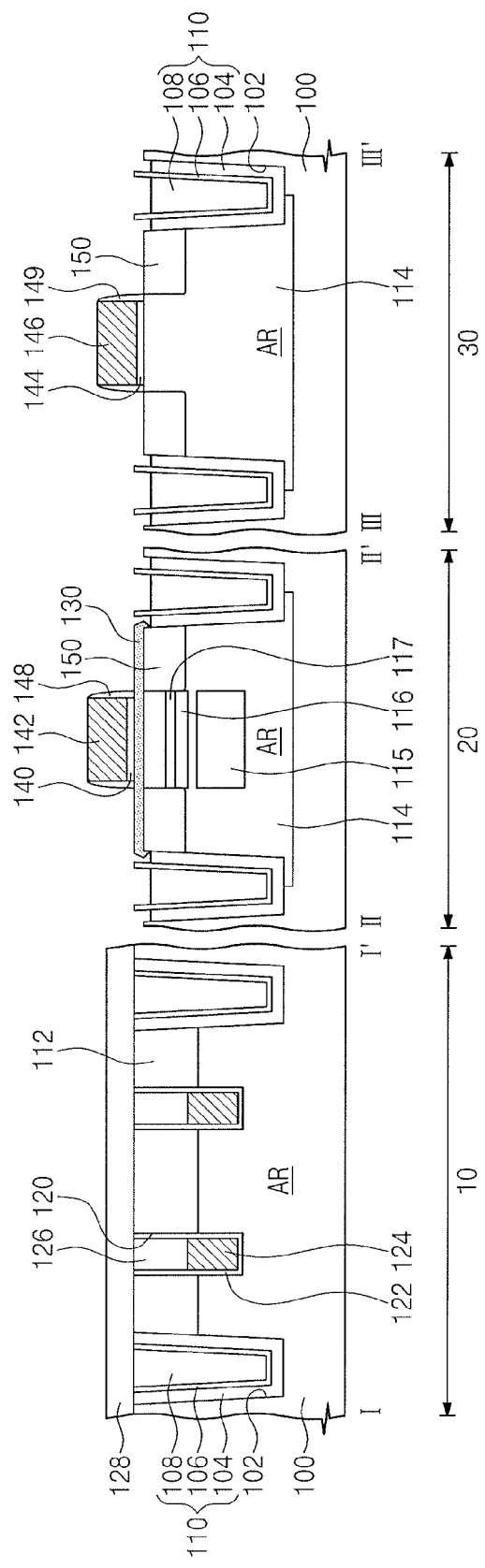

Referring to FIGS. 2 and 7E, the first mask layer 128 of the third region 30 may be removed to expose the top surface of the substrate 100 and the device isolation layer 110 of the third region 30. At this time, the first mask layer 128 of the first region 10 may remain. A second gate insulating layer 140 may be formed on the substrate 100 of the second region 20, and a third gate insulating layer 144 may be formed on the substrate 100 of the third region 30. The second and third insulating layers 140 and 144 may be formed at the same time. The second and third insulating layers 140 and 144 may be formed of, for example, a silicon oxide layer.

A second gate electrode 142 may be formed on the second gate insulating layer 140, and a third gate electrode 146 may be formed on the third gate insulating layer 144. For example, the second and third gate electrodes 142 and 146 may include at least one of poly-silicon, metal materials, or metal silicide materials. First spacers 148 may be formed to cover both sidewalls of the second gate electrode 142, and second spacers 149 may be formed to cover both sidewalls of the third gate electrode 146. For example, an insulating layer may be conformally formed on the top surface of the substrate 100 and the second and third gate electrodes 142 and 146, and an etch-back process may be performed on the insulating layer to form the first and second spacers 148 and 149.

Sixth dopant regions 150 may be formed in the substrate 100 (i.e., the active regions AR) of the second and third regions 20 and 30. The sixth dopant regions 150 may be formed by performing an ion implantation process on the substrate 100 exposed by the second and third gate electrodes 142 and 146. The sixth dopant regions 150 may be source/drain regions.

Figure 7F:
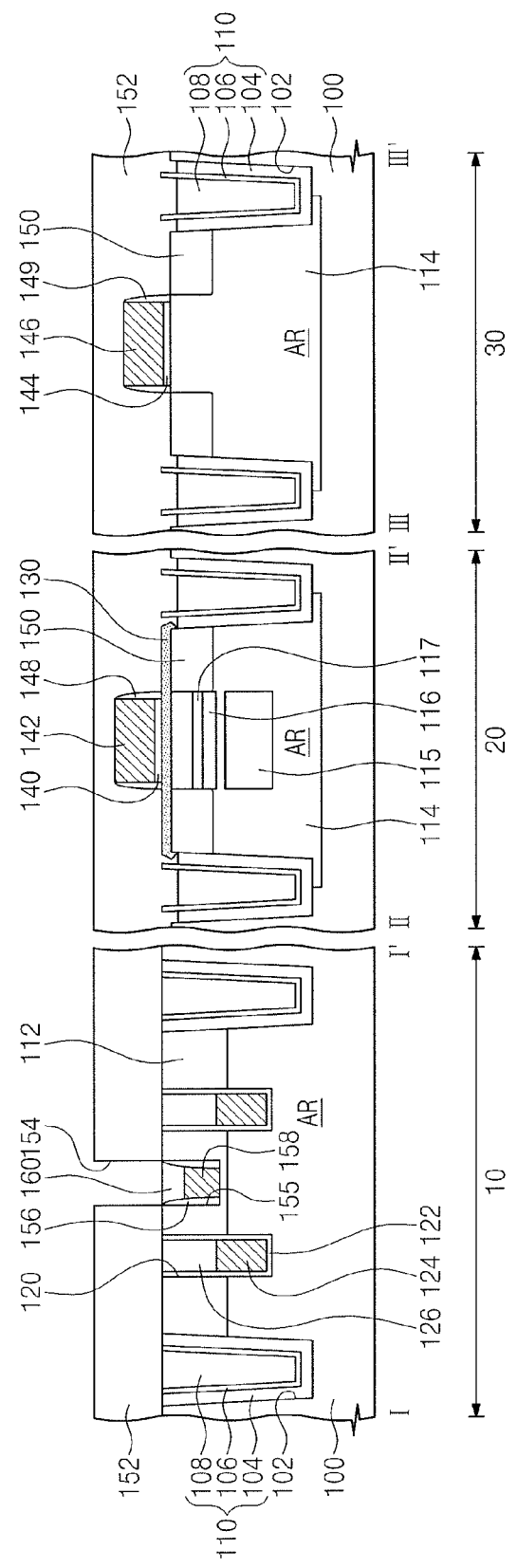

Referring to FIGS. 2 and 7F, the first mask layer 128 of the first region 10 may be removed.

A second mask layer 152 may be formed on the substrate 100 of the first to third regions 10, 20, and 30. The second mask layer 152 may have an opening that exposes a portion of the substrate 100 of the first region 10. The substrate 100 exposed by the opening 154 may be etched to form a bit line trench 155. The bit line trench 155 may extend in a second direction Y perpendicular to the first direction X to intersect the active region AR. A portion of the bit line trench 155 may be formed in the active region AR disposed between the two buried word lines 124. Third spacers 156 may be formed to cover both inner sidewalls of the bit line trench 155. A buried bit line 158 may be formed to partially fill the bit line trench 155. A second filling insulation pattern 160 may be formed to fill the bit line trench 155 on the buried bit line 158.

Referring again to FIGS. 2 and 3, the second mask layer 152 may be removed.

A first interlayer insulating layer 162 may be formed on the substrate 100 of the first, second, and third regions 10, 20, and 30. First to third contact-vias 164a, 164b, and 164c may penetrate the first interlayer insulating layer 162 of the first, second, and third regions 10, 20, and 30, respectively. The first contact-via 164a of the first region 10 may be electrically connected to the first dopant region 112 disposed between the buried word line 124 and the device isolation layer 110 adjacent to the buried word line 124. The second contact-via 164b of the second region 20 may further penetrate the channel layer 130 so as to be electrically connected to the sixth dopant region 150 of the second region 20. The third contact-via 164c of the third region 30 may be electrically connected to the sixth dopant region 150 of the third region 30. Silicide layers may be at interfaces between the substrate 100 and the contact-vias 164a, 164b, and 164c.

In an embodiment, conductive lines 165 may be formed in the second and third regions 20 and 30. In an embodiment, the conductive lines 165 may be formed on the first interlayer insulating layer 162 so as to be electrically connected to the second and third through-vias 164b and 164c. In an embodiment, the conductive line 165 of the second region 20 may be electrically connected to the buried bit line 158.

A capacitor CP may be on the first interlayer insulating layer 162 in the first region 10. The capacitor CP may include a first electrode 166 having a cylindrical shape, a dielectric layer 167 conformally covering the first electrode 166, and a second electrode 168 covering the first electrode 166 and the dielectric layer 167.

A second interlayer insulating layer 169 may be on the first interlayer insulating layer 162 in the second and third regions 20 and 30. The second interlayer insulating layer 169 may cover the conductive lines 165.

Figure 8A:
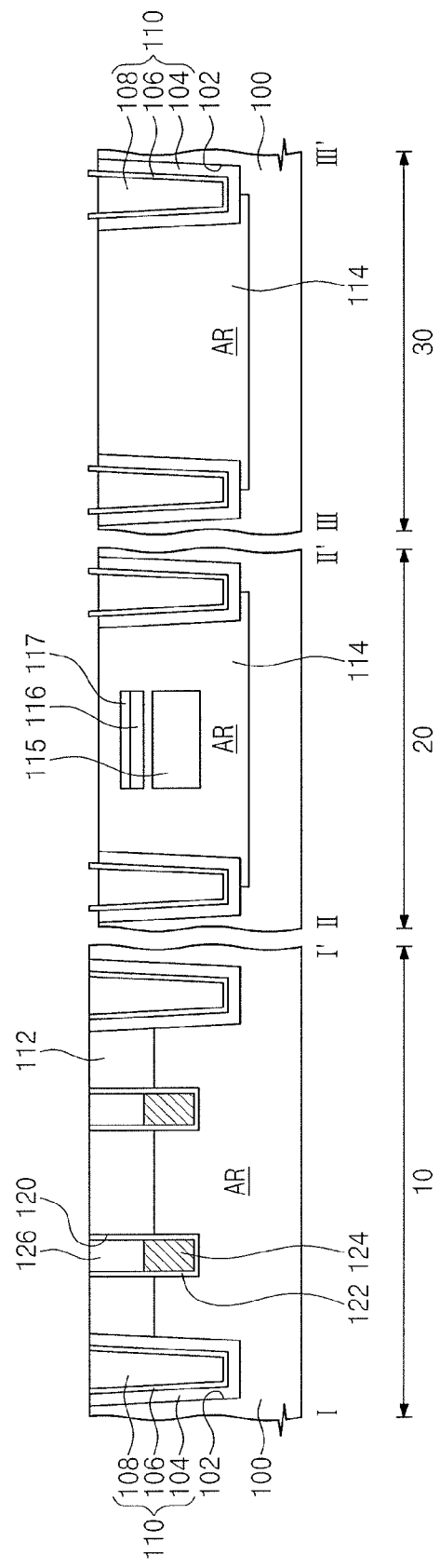
FIGS. 8A to 8C illustrate cross-sectional views taken along lines I-I', II-II', and III-III' of FIG. 2 to illustrate a method of fabricating the semiconductor device according to the second embodiment.
Figure 8B:
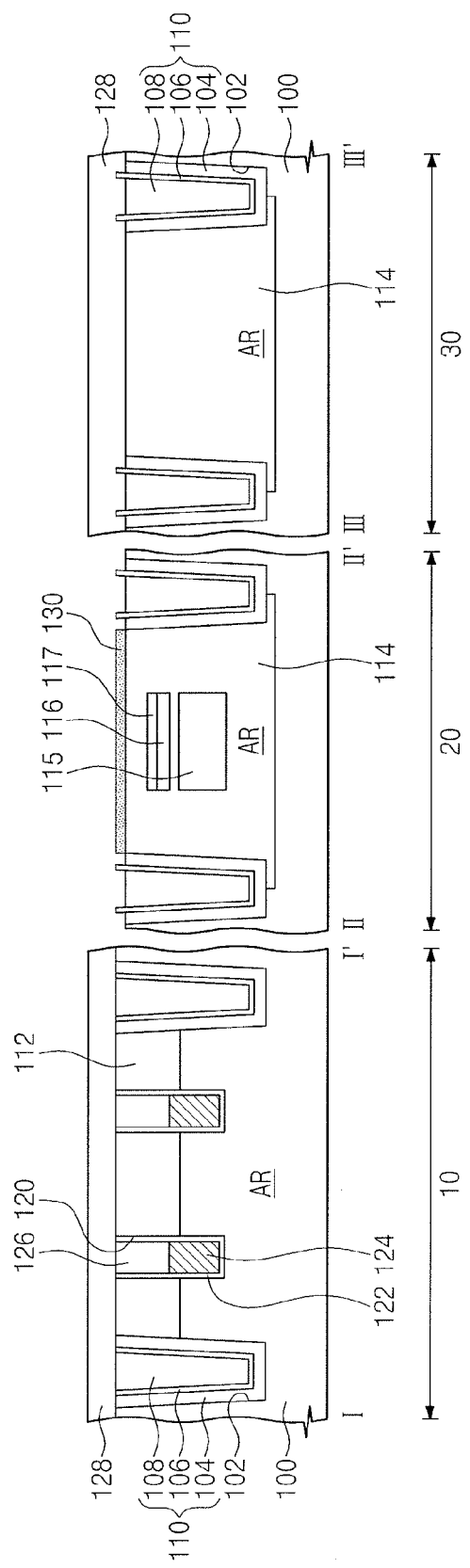
Figure 8C:
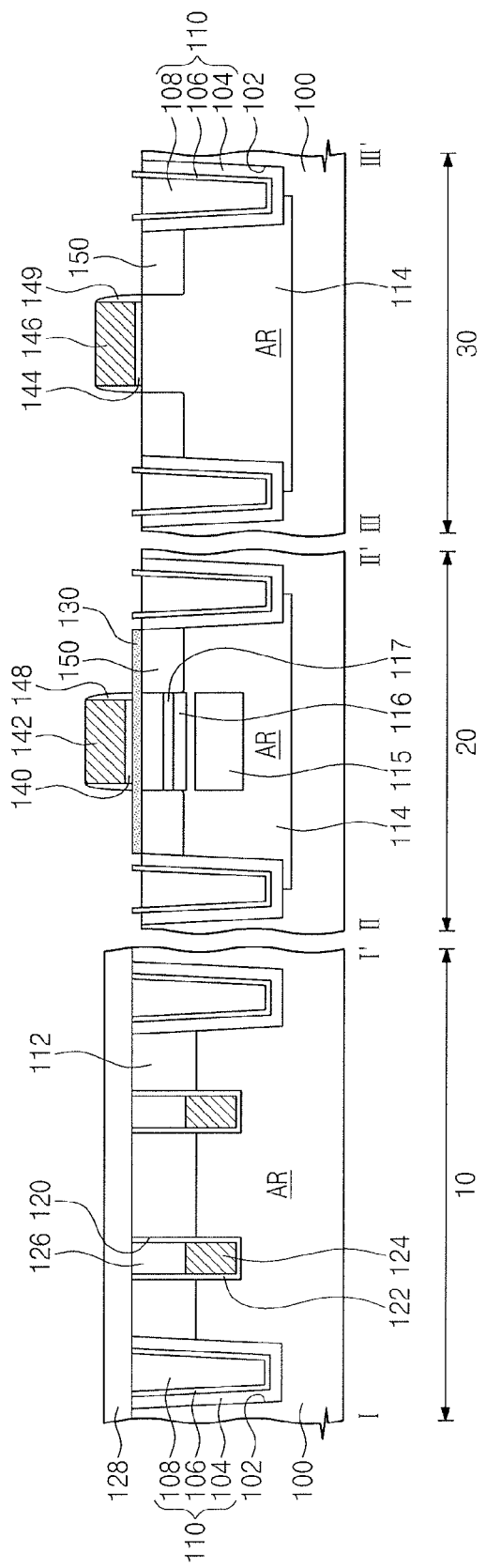

FIGS. 8A to 8C illustrate cross-sectional views taken along lines I-I', II-II', and III-III' of FIG. 2 to illustrate a method of fabricating the semiconductor device according to the second embodiment.

Referring to FIG. 8A, after the process described with reference to FIG. 7B, etching processes for forming the first gate insulating layer 122, the buried word lines 124, and the first filling insulation pattern 126 may be performed on the substrate 100 of the first region 10. The etching processes may also be performed on the substrate 100 of the second and third regions 20 and 30, and the substrate 100 and the device isolation layer 110 of the second and third regions 20 and 30 may be partially removed.

According to the present embodiment, in each of the second and third regions 20 and 30, a top surface of the substrate 100 may be disposed at the substantially same level as a topmost surface of the first insulating layer 104 and a top surface of the third insulating layer 108. The top surface of the substrate 100, the topmost surface of the first insulating layer 104, and the top surface of the third insulating layer 108 may be lower than a topmost surface of the second insulating layer 106 in each of the second and third regions 20 and 30. Thus, a portion of an upper portion of the second insulating layer 106 may be exposed by the first and third insulating layers 104 and 108.

Referring to FIG. 8B, a first mask layer 128 may be formed on the substrate 100 of the first and third regions 10 and 30, and the substrate 100 of the second region 20 may be exposed by the first mask layer 128. A channel layer 130 may be formed on the exposed surface (i.e., the active region AR) of the substrate 100 of the second region 20. The channel layer 130 may completely cover the top surface of the active region AR of the second region 20. A bottom surface of the channel layer 130 may be disposed at the substantially same level as the topmost surface of the first insulating layer 104 and the top surface of the third insulating layer 108 in the second region 20. The channel layer 130 may be grown from the top surface of the active region AR by a SEG process using the substrate 100 (i.e., the active region AR) as a seed, and the channel layer 130 may have the same physical properties as the substrate 100. For example, if the substrate 100 is formed of single-crystalline silicon, the channel 130 may be formed of a single-crystalline silicon layer.

Referring to FIG. 8C, the first mask layer 128 of the third region 30 may be removed to expose the top surface of the substrate 100 and the device isolation layer 110. A second gate insulating layer 140, a second gate electrode 142, and first spacers 148 may be formed on the substrate 100 of the second region 20. A third gate insulating layer 144, a third gate electrode 146, and second spacers 149 may be formed on the substrate 100 of the third region 30.

Sixth dopant regions 150 may be formed in the substrate 100 of the second and third regions 20 and 30. The sixth dopant regions 150 may be formed by an ion implantation process. The sixth dopant regions 150 may be, for example, source/drain regions.

Referring to FIGS. 2 and 5, the first mask layer 128 of the first region 10 may be removed. A bit line trench 155 may be formed in the substrate 100 of the first region 10. A portion of the bit line trench 155 may be formed in the active region AR disposed between the two buried word lines 124 in the first region 10. Third spacers 156 may be formed to cover both inner sidewalls of the bit line trench 155, and a buried bit line 158 may be formed to partially fill the bit line trench 155. A second filling insulation pattern 160 may be formed to fill the bit line trench 155 on the buried bit line 158.

A first interlayer insulating layer 162 may be formed on the substrate 100 of the first, second, and third regions 10, 20, and 30. First to third contact-vias 164a, 164b, and 164c may penetrate the first interlayer insulating layer 162 of the first, second, and third regions 10, 20, and 30, respectively.

Conductive lines 165 may be in the second and third regions 20 and 30. The conductive lines 165 may be on the first interlayer insulating layer 162 so as to be electrically connected to the second and third through-vias 164b and 164c.

A capacitor CP may be on the first interlayer insulating layer 162 in the first region 10. A second interlayer insulating layer 169 may be on the first interlayer insulating layer 162 in the second and third regions 20 and 30.

Figure 9A:
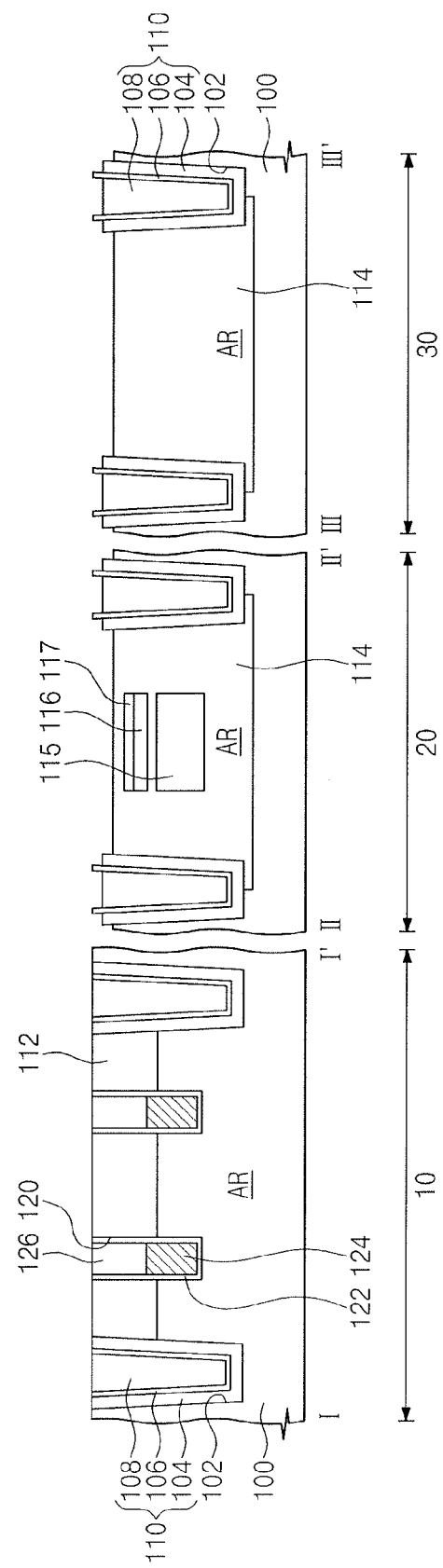
FIGS. 9A to 9C illustrate cross-sectional views taken along lines I-I', II-II', and III-III' of FIG. 2 to illustrate a method of fabricating the semiconductor device according to the third embodiment.
Figure 9B:
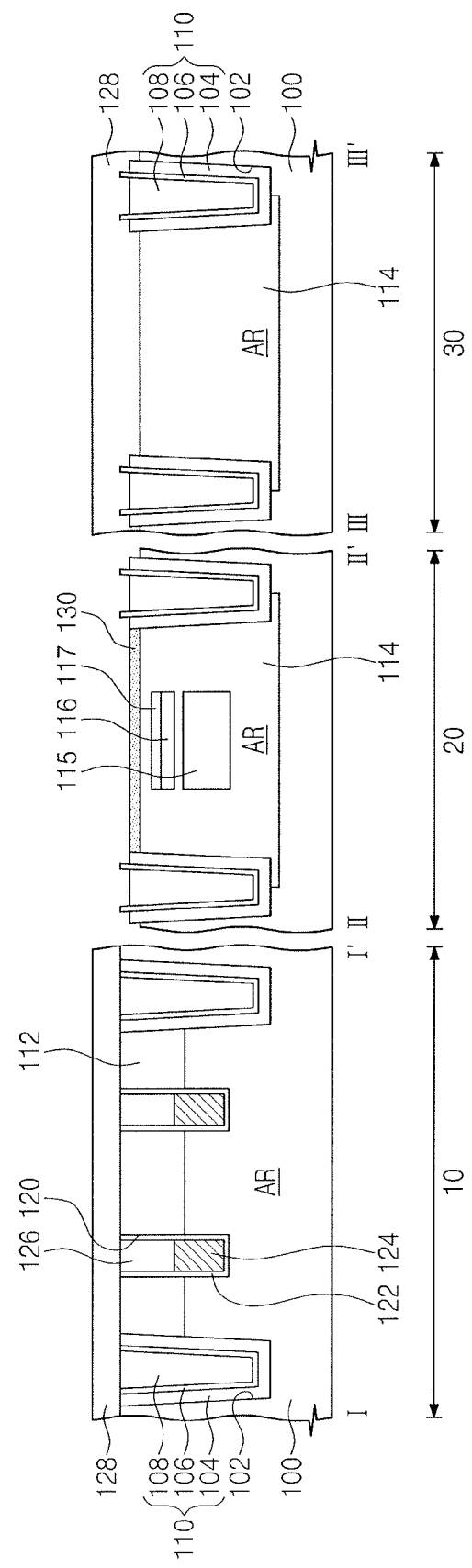
Figure 9C:
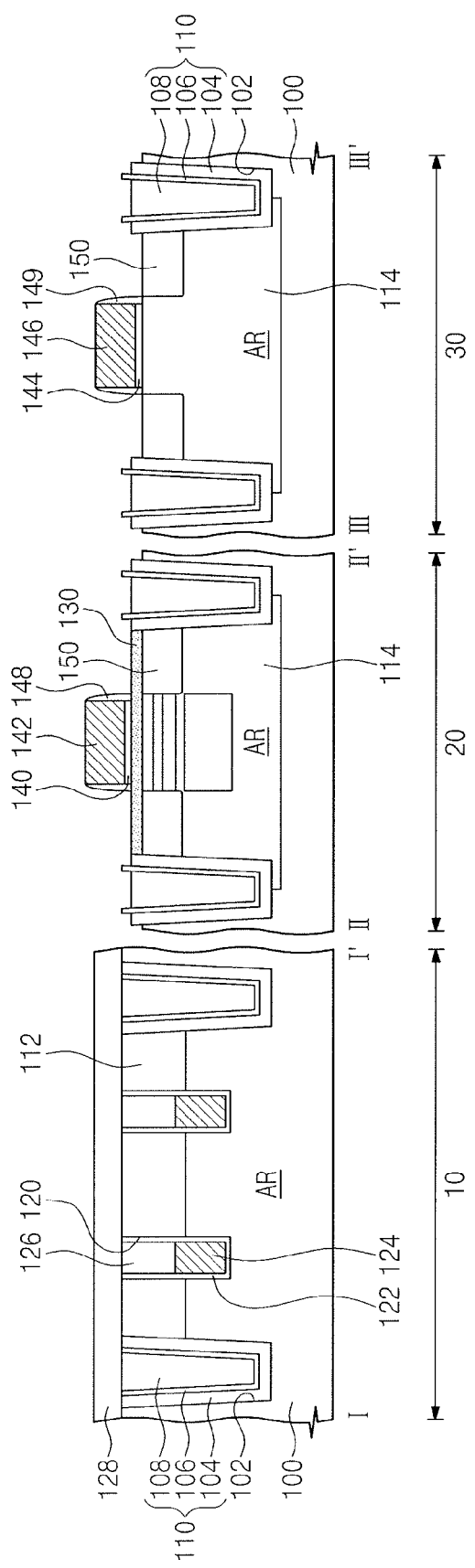

FIGS. 9A to 9C illustrate cross-sectional views taken along lines I-I', II-II', and III-III' of FIG. 2 to illustrate a method of fabricating the semiconductor device according to the third embodiment.

Referring to FIG. 9A, etching processes for forming the first gate insulating layer 122, the buried word lines 124, and the first filling insulation pattern 126 may be performed on the substrate 100 of the first region 10 after the process described with reference to FIG. 7B. The etching processes may also be performed on the substrate 100 of the second and third regions 20 and 30, and the substrate 100 and the device isolation layer 110 of the second and third regions 20 and 30 may be partially removed.

According to the present embodiment, by the aforementioned etching processes, the substrate 100 may be etched more than the first and third insulating layers 104 and 108 in each of the second and third regions 20 and 30. In other words, the top surface of the substrate 100 may be lower than the topmost surface of the first insulating layer 104 and the top surface of the third insulating layer 108 in each of the second and third regions 20 and 30, and a portion of the sidewall of the first insulating layer 104 adjacent to the substrate 100 (i.e., the active region AR) may be exposed in each of the second and third regions 20 and 30. The topmost surface of the first insulating layer 104 and the top surface of the third insulating layer 108 may be lower than the topmost surface of the second insulating layer 106 in each of the second and third regions 20 and 30. In other words, the top surface of the substrate 100 may be lower than a top surface of the device isolation layer 110 in each of the second and third regions 20 and 30.

Referring to FIG. 9B, a first mask layer 128 may be formed on the substrate 100 of the first and third regions 10 and 30, and the substrate 100 of the second region 20 may be exposed by the first mask layer 128. A channel layer 130 may be formed on the exposed surface (i.e., the active region AR) of the substrate 100 of the second region 20. The channel layer 130 may completely cover the top surface of the active region AR of the second region 20. A bottom surface of the channel layer 130 may be lower than the topmost surface of the first insulating layer 104 and the top surface of the third insulating layer 108 in the second region 20. The channel layer 130 may be grown from the top surface of the active region AR by a SEG process using the substrate 100 (i.e., the active region AR) as a seed, and the channel layer 130 may have the same physical properties as the substrate 100. For example, if the substrate 100 is formed of single-crystalline silicon, the channel 130 may be formed of a single-crystalline silicon layer.

Referring to FIG. 9C, the first mask layer 128 of the third region 30 may be removed to expose the top surface of the substrate 100 and the device isolation layer 110. A second gate insulating layer 140, a second gate electrode 142, and first spacers 148 may be formed on the substrate 100 of the second region 20. A third gate insulating layer 144, a third gate electrode 146, and second spacers 149 may be formed on the substrate 100 of the third region 30.

Sixth dopant regions 150 may be formed in the substrate 100 (i.e., the active regions AR) of the second and third regions 20 and 30. The sixth dopant regions 150 may be formed by an ion implantation process. The sixth dopant regions 150 may be, for example, source/drain regions.

Referring to FIGS. 2 and 6, the first mask layer 128 of the first region 10 may be removed. A bit line trench 155 may be formed in the substrate 100 of the first region 10. A portion of the bit line trench 155 may be in the active region AR disposed between the two buried word lines 124 in the first region 10. Third spacers 156 may cover both inner sidewalls of the bit line trench 155, and a buried bit line 158 may be partially fill the bit line trench 155. A second filling insulation pattern 160 may fill the bit line trench 155 on the buried bit line 158.

A first interlayer insulating layer 162 may be on the substrate 100 of the first, second, and third regions 10, 20, and 30. First to third contact-vias 164a, 164b, and 164c may penetrate the first interlayer insulating layer 162 of the first, second, and third regions 10, 20, and 30, respectively.

Conductive lines 165 may be in the second and third regions 20 and 30. The conductive lines 165 may be on the first interlayer insulating layer 162 so as to be electrically connected to the second and third through-vias 164b and 164c.

A capacitor CP may be on the first interlayer insulating layer 162 in the first region 10. A second interlayer insulating layer 169 may be on the first interlayer insulating layer 162 formed in the second and third regions 20 and 30.

Figure 10:
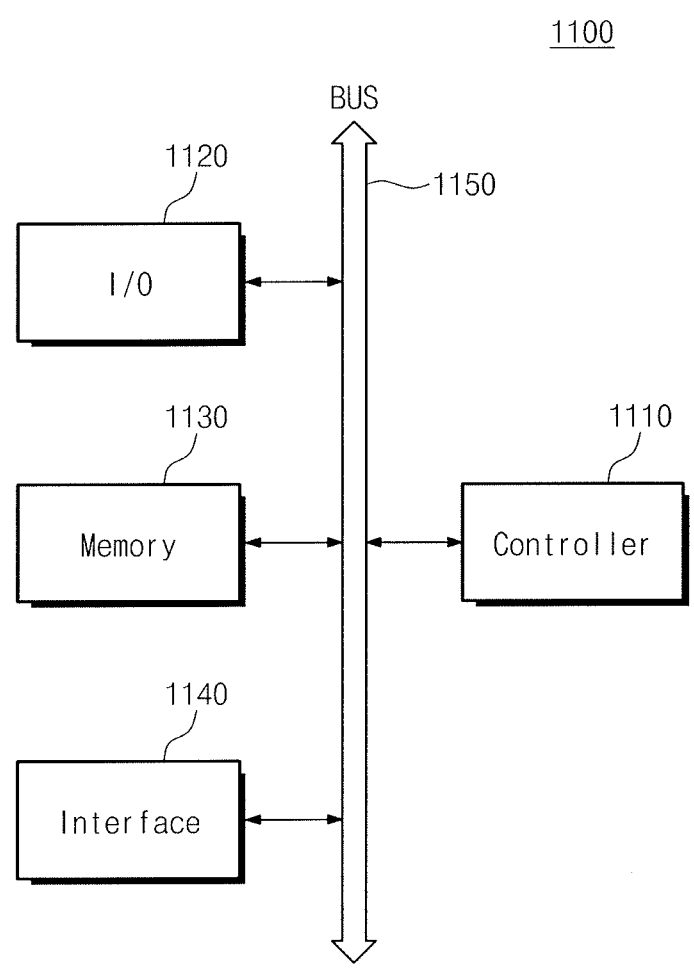
FIG. 10 illustrates a schematic block diagram of an embodiment of an electronic system including a semiconductor device according to embodiments.

FIG. 10 illustrates a schematic block diagram of an embodiment of an electronic system including a semiconductor device according to embodiments.

Referring to FIG. 10, an electronic system 1100 according to embodiments may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data are transmitted. At least one of the controller 1110, the I/O unit 1120, the memory device 1130, and the interface unit 1140 may include at least one of the semiconductor devices according to the aforementioned embodiments.

The controller 1110 may include at least one of a microprocessor, a digital signal processor, a microcontroller, or another logic device having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. The electronic system 1100 may further include a fast DRAM device and/or a fast static random access memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products. The other electronic products may receive or transmit information data by wireless.

Figure 11:
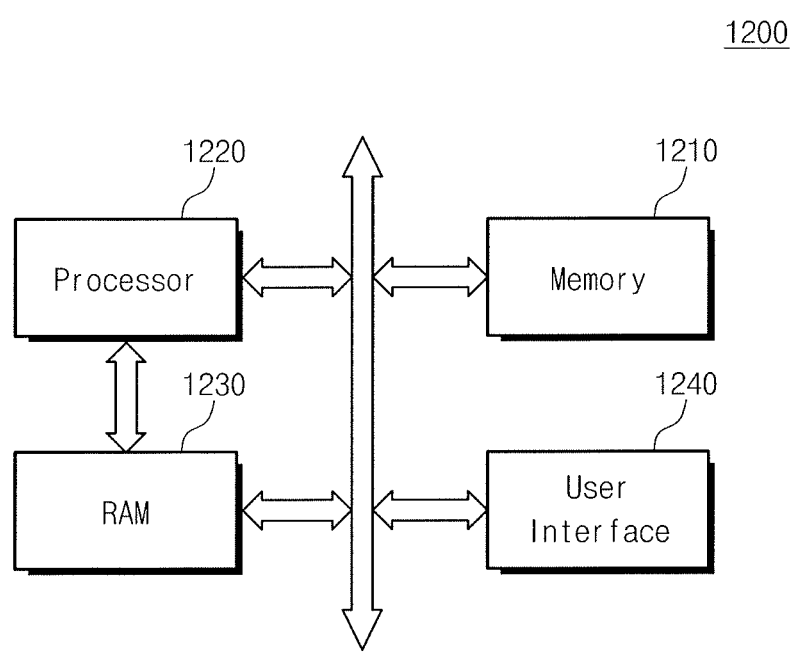
FIG. 11 illustrates a schematic block diagram of an embodiment of an electronic system including a semiconductor device according to embodiments.

FIG. 11 illustrates a schematic block diagram of an embodiment of an electronic system including a semiconductor device according to embodiments Referring to FIG. 11, an electronic system 1200 may include at least one of the semiconductor devices according to the aforementioned embodiments. The electronic system 1200 may include a mobile device or a computer. For example, the electronic system 1200 may include a memory system 1210, a processor 1220, a RAM 1230, and a user interface unit 1240 which communicate with each other through a data bus. The processor 1220 may execute a program and may control the electronic system 1200. The RAM 1230 may be used as a working memory of the processor 1220. For example, each of the processor 1220 and the RAM may include at least one of the semiconductor devices according to the embodiments. In other embodiments, the processor 1220 and the RAM 1230 may be included in one package. The user interface unit 1240 may be used to input/output data into/from the electronic system 1200. The memory system 1210 may store codes used for operating the processor 1220, data processed by the processor 1220, and/or data inputted from an external system. The memory system 1210 may include a controller and a memory.

The electronic system 1200 may be realized as a mobile system, a personal computer, an industrial computer, or a logic system performing various functions. For example, the mobile system may be one of a PDA, a portable computer, a web tablet, a mobile phone, a wireless phone, a laptop computer, a memory card, a digital music player, or a data transmitting/receiving system. If the electronic system 1200 is realized as a wireless communication apparatus, the electronic device 1200 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

By way of summation and review, a deeply depleted channel (DDC) transistor may reduce a variation of a threshold voltage to realize the scaling down of complementary metal-oxide-semiconductor (CMOS) elements. The DDC transistor may be driven using a deeply depleted channel that may be formed when a voltage is applied to its gate. An undoped or lightly doped region of the DDC transistor may remove dopants of a channel to form the deeply depleted channel, and RDF may be removed to increase an effective current. It may be difficult to form the DDC transistor and the buried gate on the same wafer.

Embodiments relate to a semiconductor device that may include a memory element and a method of fabricating the same. Embodiments may provide a semiconductor device that may be capable of improving performance. Embodiments may provide a method of fabricating a semiconductor device with improved performance.

In the method of fabricating the semiconductor device according to embodiments, the first mask layer may be formed on the substrate of the first region to selectively expose the substrate of the second region. Subsequently, the channel layer may be selectively formed on the substrate (i.e., the active region) of the second region, and the channel layers may be selectively formed in regions requiring transistors having the same threshold voltage on the same wafer.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   etching a portion of a substrate including a first region and a second region to form a device isolation trench;
   forming a device isolation layer defining active regions by sequentially stacking a first insulating layer, a second insulating layer, and a third insulating layer on an inner surface of the device isolation trench;
   forming word lines buried in the substrate of the first region, the word lines extending in a first direction to intersect the active region of the first region, the word lines being spaced apart from each other;
   forming a first mask layer covering the word lines on the substrate of the first region, the first mask layer exposing the substrate of the second region;
   forming a channel layer on the substrate of the second region; and
   forming a gate electrode on the channel layer.

2. The method as claimed in claim 1, wherein, during formation of word lines, the first and third insulating layers of the second region are etched to expose a portion of an upper portion of the second insulating layer of the second region.

3. The method as claimed in claim 1, wherein, during formation of the word lines, the first and third insulating layers of the second region are etched more than the substrate of the second region such that a portion of a sidewall of the substrate adjacent to the first insulating layer is exposed in the second region.

4. The method as claimed in claim 3, wherein:
   the channel layer includes:
     a bottom surface having a first bottom surface in contact with a top surface of the substrate and a second bottom surface in contact with the exposed portion of the sidewall of the substrate;
     a top surface opposite to the first bottom surface; and
     a sidewall connected to one end of the bottom surface and one end of the top surface of the channel layer,
   the sidewall of the channel layer includes a first sidewall and a second sidewall that meet each other at a first point,
   the first sidewall connects the first point to a second point at which the first insulating layer meets the sidewall of the substrate, and
   the second sidewall connects the one end of the top surface of the channel layer to the first point.

5. The method as claimed in claim 4, wherein the sidewall of the channel layer has a corner at the first point.

6. The method as claimed in claim 4, wherein:
   a first angle between the first sidewall and the second sidewall is greater than 0 degrees and less than 180 degrees,
   a second angle between the first sidewall and the sidewall of the substrate is greater than 0 degrees and less than 90 degrees, and
   a third angle between the second sidewall and the top surface of the channel layer is greater than 0 degrees and less than 180 degrees.

7. The method as claimed in claim 1, wherein:
   during formation of the word lines, the first and third insulating layers and the substrate of the second region are etched such that an etched top surface of the substrate is at a substantially same level as etched topmost surfaces of the first and third insulating layers in the second region, and
   in the second region, a topmost surface of the second insulating layer is higher than the etched top surface of the substrate and the etched topmost surfaces of the first and third insulating layers.

8. The method as claimed in claim 1, wherein, during formation of the word lines, the substrate of the second region is etched more than the first and third insulating layers of the second region such that a portion of a sidewall of the first insulating layer adjacent to the substrate is exposed in the second region.

9. The method as claimed in claim 8, wherein the channel layer is in contact with the exposed portion of the sidewall of the first insulating layer.

10. The method as claimed in claim 1, wherein forming the channel layer includes a selective epitaxial growth (SEG) process using the substrate of the second region as a seed.

11. The method as claimed in claim 1, further comprising, after forming the gate electrode:
    removing the first mask layer;
    forming a bit line buried in the substrate of the first region, the bit line extending in a second direction perpendicular to the first direction to intersect a portion of the active region between the word lines;
    forming an interlayer insulating layer covering the substrate of the first and second regions;
    forming contact-vias penetrating the interlayer insulating layer of the first and second regions, respectively; and
    forming a capacitor connected to the contact-via in the first region.

12. A method of fabricating a semiconductor device, the method comprising:
    forming a device isolation trench in a substrate including a first region, a second region, and a third region;
    forming a device isolation layer in the device isolation trench;

removing portions of the device isolation layer in the second region and in the third region;

forming a first mask layer in the first region and the third region to selectively expose the substrate of the second region, removing portions of the device isolation layer in the third region before forming the first mask layer;

selectively forming a channel layer on the substrate of the second region, the channel layer including a sidewall that extends into the device isolation trench in the second region;

removing the first mask layer of the third region to expose a top surface of the substrate and the device isolation layer of the third region, while retaining the first mask layer of the first region; and simultaneously forming a second gate insulating layer on the substrate of the second region, and a third gate insulating layer on the substrate of the third region.

13. The method as claimed in claim 12, wherein selectively forming the channel layer on the substrate of the second region includes a selective epitaxial growth (SEG) process.

14. The method as claimed in claim 12, further comprising:

forming a second gate electrode on the second gate insulating layer; and forming a third gate electrode on the third gate insulating layer.

15. The method as claimed in claim 12, further comprising:

forming a second mask layer on the substrate in the first to second regions, the second mask layer having an opening that exposes a portion of the substrate of the first region; and etching the substrate exposed by the opening.

16. The method as claimed in claim 12, wherein:

forming the device isolation layer includes:

forming a first insulating layer in the device isolation trench;

forming a second insulating layer conformally covering the first insulating layer; and forming a third insulating layer on the second insulating layer; and removing portions of the device isolation layer in the second region includes removing upper portions of first and third insulating layers.

17. The semiconductor device as claimed in claim 12, wherein the sidewall of the channel layer has a point extending into the device isolation trench in the second region.

18. A method of fabricating a semiconductor device, the method comprising:

forming a device isolation trench in a substrate including a first region and a second region;

forming a device isolation layer in the device isolation trench;

removing portions of the device isolation layer in the second region;

forming a first mask layer in the first region to selectively expose the substrate of the second region;

selectively forming a channel layer on the substrate of the second region, the channel layer including a sidewall that extends into the device isolation trench in the second region, wherein:

forming the device isolation layer includes:

forming a first insulating layer in the device isolation trench;

forming a second insulating layer conformally covering the first insulating layer; and forming a third insulating layer on the second insulating layer; and removing portions of the device isolation layer in the second region includes removing upper portions of first and third insulating layers, and removing a portion of the substrate in the second region such that a top surface of the substrate in the second region is higher than topmost surfaces of the first and third insulating layers and lower than a top most surface of the second insulating layer.

* * * * *